United States Patent
Maruthamuthu

(10) Patent No.: US 12,400,977 B2
(45) Date of Patent: Aug. 26, 2025

(54) INTEGRATED CIRCUIT (IC) PACKAGE EMPLOYING ON-PACKAGE TUNABLE INDUCTOR FORMED IN REDISTRIBUTION LAYER (RDL) FOR IMPEDANCE TUNER CIRCUIT, AND RELATED METHODS

(71) Applicant: QUALCOMM Incorporated, San Diego, CA (US)

(72) Inventor: Saravana Maruthamuthu, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 662 days.

(21) Appl. No.: 17/664,727

(22) Filed: May 24, 2022

(65) Prior Publication Data

US 2023/0387044 A1    Nov. 30, 2023

(51) Int. Cl.
*H01L 23/66* (2006.01)
*H01L 21/48* (2006.01)
(Continued)

(52) U.S. Cl.
CPC ............ *H01L 23/66* (2013.01); *H01L 21/486* (2013.01); *H01L 23/49833* (2013.01); *H01L 23/49838* (2013.01); *H04B 1/0078* (2013.01); *H04B 1/0483* (2013.01); *H01L 21/4857* (2013.01); *H01L 23/49816* (2013.01); *H01L 23/49822* (2013.01); *H01L 24/16* (2013.01); *H01L 2223/6622* (2013.01); *H01L 2223/6672* (2013.01); *H01L 2223/6688* (2013.01);
(Continued)

(58) Field of Classification Search
CPC ..... H10D 1/20; H01L 21/486; H01L 21/4857; H01L 23/66; H01L 23/49833; H01L 23/49838; H04B 1/0078; H04B 1/0483

USPC ......................................................... 257/531
See application file for complete search history.

(56) References Cited

U.S. PATENT DOCUMENTS 10,490,621 B1 * 11/2019 Thadesar .......... H01L 23/49822
11,451,251 B2 * 9/2022 Horita ................. H04B 1/1018
(Continued)

OTHER PUBLICATIONS

International Search Report and Written Opinion for International Patent Application No. PCT/US2023/021664, mailed Sep. 1, 2023, 18 pages.

*Primary Examiner* — Igwe U Anya
(74) *Attorney, Agent, or Firm* — Withrow & Terranova, PLLC

(57) ABSTRACT

Integrated circuit (IC) package employing on-package tunable inductor formed in redistribution layer (RDL) for impedance tuner circuit, and related methods. The IC package includes an impedance tuner circuit that includes a tunable inductor that can be tuned to change the frequency response of the impedance tuner circuit. To reduce the circuit area, the tunable inductor is formed in a RDL of a package substrate of the IC package. The IC package also includes a semiconductor die ("die") that includes other components of the impedance tuner circuit that are coupled to the tunable inductor by the die being coupled to the package substrate. In this manner, by the tunable inductor being formed in a RDL in the package substrate, the signal path lengths between the tunable inductor and other components of the tunable impedance circuit are reduced, thereby reducing inductance path resistance and improving quality (Q) factor of the tunable inductor.

21 Claims, 15 Drawing Sheets

(51) Int. Cl.
*H01L 23/00* (2006.01)
*H01L 23/498* (2006.01)
*H04B 1/00* (2006.01)
*H04B 1/04* (2006.01)

(52) U.S. Cl.
CPC ............... *H01L 2224/16225* (2013.01); *H01L 2924/30101* (2013.01); *H01L 2924/30105* (2013.01); *H01L 2924/30107* (2013.01); *H01L 2924/3011* (2013.01)

(56) References Cited

U.S. PATENT DOCUMENTS

| | | |
|---|---|---|
| 2016/0233192 A1 | 8/2016 | Dosluoglu |
| 2017/0207022 A1* | 7/2017 | Song ................. H01L 23/49822 |
| 2017/0207293 A1* | 7/2017 | Song ........................ H10D 1/20 |
| 2021/0160999 A1 | 5/2021 | Dogiamis et al. |
| 2021/0313284 A1* | 10/2021 | Noori .................... H01L 25/072 |
| 2021/0313285 A1* | 10/2021 | Noori ................ H01L 23/49861 |
| 2021/0313935 A1* | 10/2021 | Noori .................... H01L 23/481 |

* cited by examiner

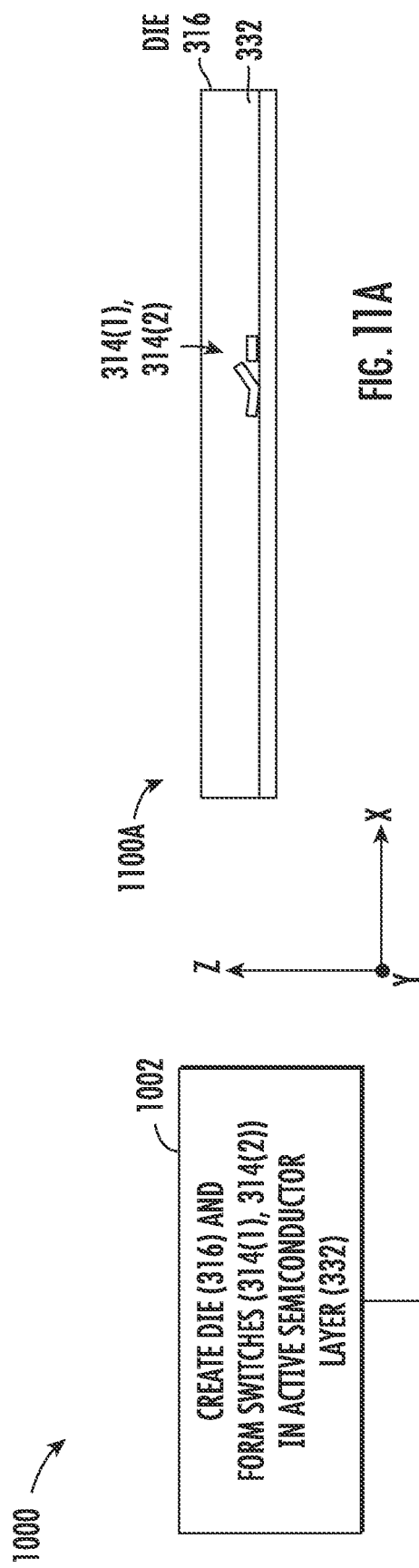

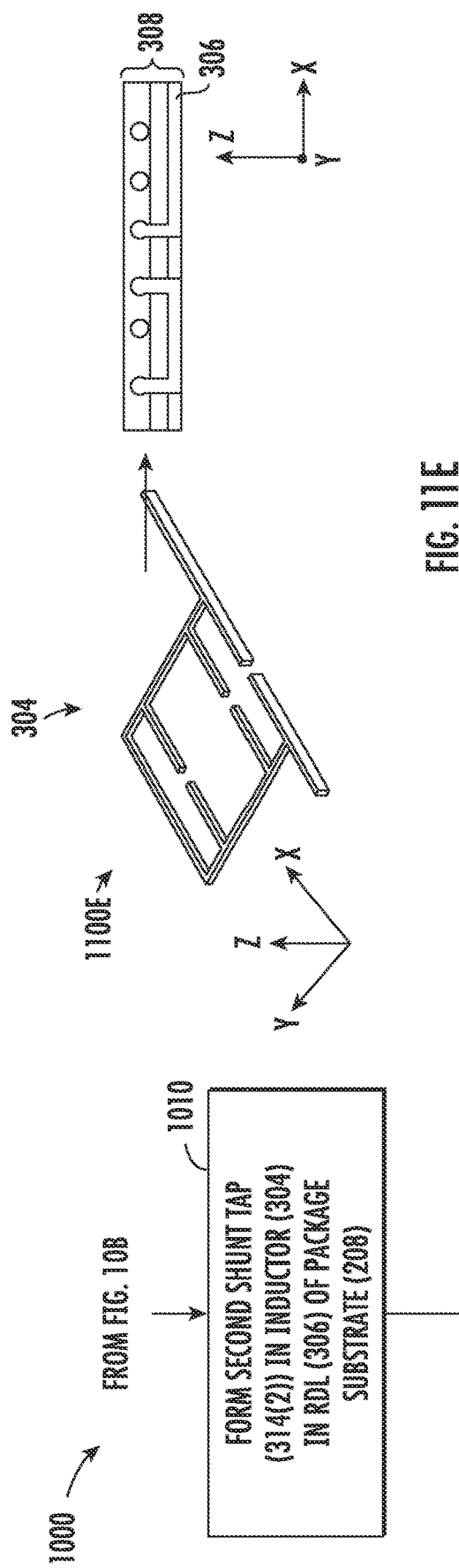
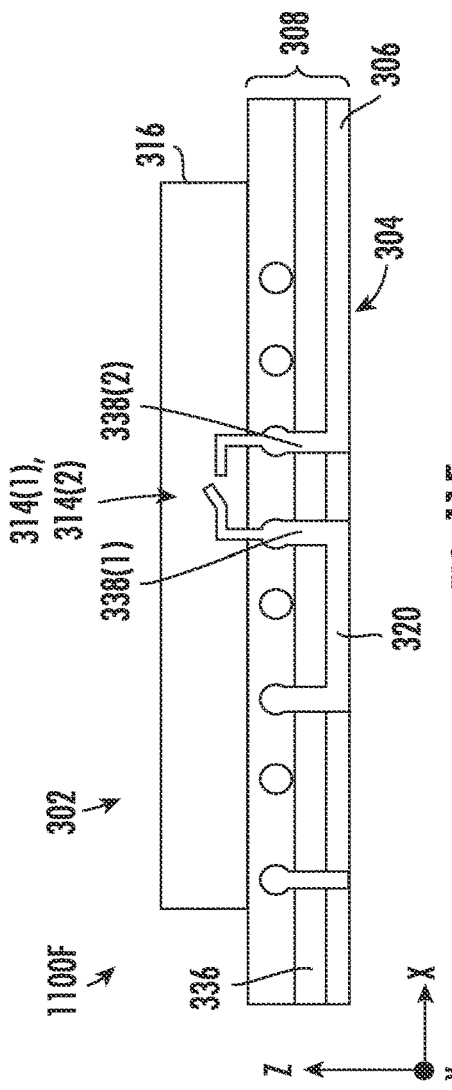
FIG. 11E
FIG. 11F
FIG. 10C

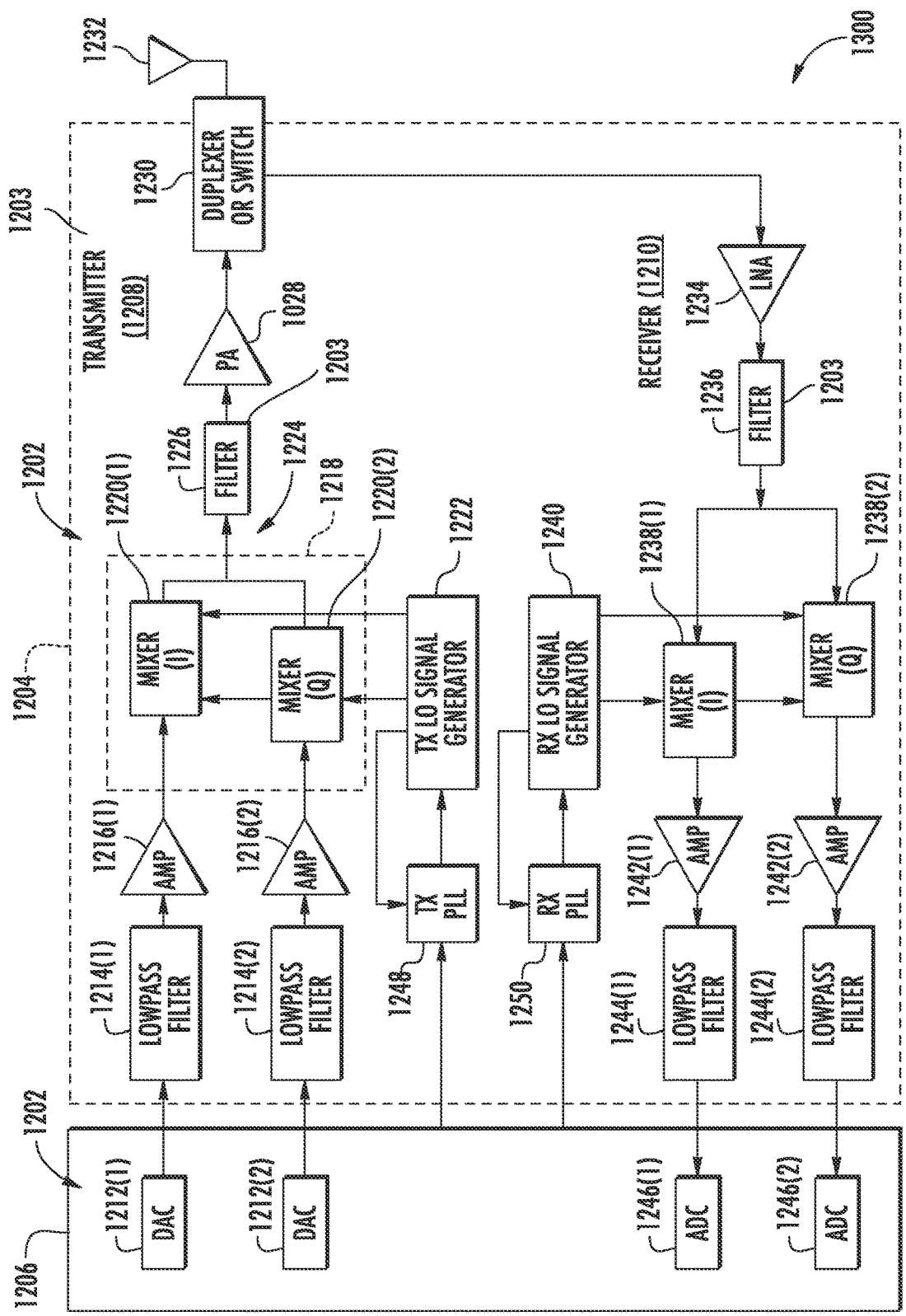

INTEGRATED CIRCUIT (IC) PACKAGE EMPLOYING ON-PACKAGE TUNABLE INDUCTOR FORMED IN REDISTRIBUTION LAYER (RDL) FOR IMPEDANCE TUNER CIRCUIT, AND RELATED METHODS

BACKGROUND

I. Field of the Disclosure

The field of the disclosure relates to impedance tuners that can be employed in a transceiver circuit to filter radio-frequency (RF) signals, wherein the impedance tuners employ a tunable resistor, capacitor, and inductor network to filter particular frequency bands.

II. Background

A radio frequency (RF) transceiver includes a RF transmit circuit chain that conventionally includes an RF power amplifier (PA) to amplify a RF signal for transmission as an output RF signal within a given frequency band. The RF transmit circuit chain may also include an output impedance tuner circuit to filter the output RF signal in a desired frequency range or bandwidth. The RF transceiver also includes a RF receive circuit chain that conventionally includes a low-noise amplifier (LNA) coupled to an antenna that receives an input RF signal. The RF receiver circuit chain may also include an input impedance tuner circuit to filter the input RF signal to the desired frequency range of bandwidth. The impedance tuner circuits conventionally include a resistor, capacitor, and inductor network to filter the RF signals. The impedance tuner circuits may also include a switched variable capacitor and series of switches that can be programmed to selectively couple inductors into the RF signal path to control the filter performance.

It may be desired to integrate a RF transceiver in an integrated circuit (IC) package that can be coupled to a printed circuit board (PCB) to conserve area. This is opposed to providing and coupling the discrete components of the RF transceiver on the PCB. However, discrete inductors for the impedance tuner are mounted on the PCB outside the IC package due to their size. These discrete inductors are coupled through programmable switches to the impedance tuner in the IC package. External pins of the IC package are coupled to electrical traces in the PCB coupled to the discrete inductors to the impedance tuner circuit in the IC package. However, the discrete inductors being located outside the IC package increases the length of the conductive paths coupling the discrete inductors to the impedance tuner circuit, thereby increasing resistance in the inductive paths. Increasing resistance in the inductive paths reduces the quality (Q) factor of the discrete inductors, thereby reducing the filter performance of the impedance tuner circuit.

SUMMARY OF THE DISCLOSURE

Aspects disclosed herein include an integrated circuit (IC) package employing an on-package tunable inductor formed in a redistribution layer (RDL) for an impedance tuner circuit. Related methods are also disclosed. The IC package includes an impedance tuner circuit that includes a tunable inductor that can be tuned to change the frequency response of the impedance tuner circuit. To reduce circuit area needed to provide the tunable inductor, the tunable inductor is integrated in an IC package. In exemplary aspects, the tunable inductor is formed in a RDL of a package substrate of the IC package. The IC package also includes a semiconductor die ("die") that includes other components of the impedance tuner circuit coupled to the tunable inductor by the die being coupled to the package substrate. In this manner, by the tunable inductor being formed in a RDL in the package substrate, the signal path lengths between the tunable inductor and other components of the tunable impedance circuit are reduced, thereby reducing the inductance path resistance and improving the quality (Q) factor of the tunable inductor. Also, by forming the tunable inductor in a RDL of the IC package, the tunable inductor can be formed of the desired geometry to provide the desired inductance frequency response.

In exemplary aspects, the tunable inductor can be formed in the RDL of a package substrate of an IC package as a metal line having a first terminal and second terminal that can be coupled to a circuit to couple the inductance of the tunable inductor to the circuit. The tunable inductor is also formed in the RDL to have one or more shunt taps. A shunt tap is two metal lines formed in the tunable inductor that have ends adjacent to each other, but forming a short circuit. One or more switches in an active semiconductor layer in a front-end-of-line (FEOL) of the die as part of the impedance tuner circuit are coupled to respective shunt taps in the tunable inductor through signal path routing in the package substrate between the die and the tunable inductor in the RDL. The switches in the die can be programmed/controlled to either shunt the shunt tap or leave their respective, coupled shunt tap as an open circuit, to change the inductance of the inductor and shift the frequency response of the impedance tuner circuit. In this manner, the switches allow the inductance of the inductor to be tuned through the controlling of the shunting or not shunting of the one or more shunt taps in the inductor. The tunable inductor being disposed in the RDL in the package substrate of the IC package locates the shunt taps closer to respective switches in the die to reduce inductance path length, thereby reducing resistance and improving inductance Q factor. Also, because the inductor is formed as a metal line in the RDL, the inductor and its shunt taps can be formed in the RDL of the desired geometry and connectivity arrangement as part of fabricating the package substrate, to provide the desired inductance tunability of the inductor.

In other exemplary aspects, the tunable inductor is formed as a two-dimensional (2D) inductor such that the tunable inductor is formed in a single RDL in the package substrate of the IC package. In another exemplary aspect, the tunable inductor is formed as three-dimensional (3D) inductor such that the tunable inductor is formed in multiple RDLs of the package substrate of the IC package.

In this regard, in one exemplary aspect, an IC package is provided. The IC package comprises an impedance tuner circuit comprising a first switch, and an inductor comprising a first terminal and a second terminal. The IC package also comprises a package substrate comprising a first RDL, the first RDL comprising the inductor. The IC package also comprises a die coupled to the package substrate, the die comprising the first switch. The inductor comprises a first metal line in the first RDL, the first metal line comprising the first terminal and the second terminal, and a first shunt tap in the first RDL. The first shunt tap is coupled to the first terminal and the second terminal. The first switch is coupled to the first shunt tap.

In another exemplary aspect, a method of fabricating an IC package is provided. The method comprises forming a first switch in a die. The method also comprises forming an inductor in a package substrate, comprising forming a first metal line of the inductor in the first redistribution layer (RDL) in the package substrate, the first metal line comprising a first terminal and a second terminal, and forming a first shunt tap of the inductor in the first RDL, the first shunt tap coupled to the first terminal and the second terminal. The method also comprises coupling the die to the package substrate. The method also comprises coupling the first switch to the first shunt tap.

BRIEF DESCRIPTION OF THE FIGURES

FIGS. 10A-10D is a flowchart illustrating another exemplary fabrication process of fabricating an IC package that includes an impedance tuner circuit that includes a tunable inductor formed in a RDL of a package substrate, wherein the tunable inductor includes one or more shunt taps configured to be shunted by respective switches of the impedance tuner circuit in a die coupled to the package substrate, including but not limited to the IC packages in FIGS. 3A-4 and 6A-8B;

FIGS. 11A-11G illustrate exemplary fabrication stages according to the exemplary IC package fabrication process in FIGS. 10A-10D; and FIG. 12 is a block diagram of an exemplary wireless communications device that can include an IC package that includes an impedance tuner circuit that includes a tunable inductor that is formed in a RDL of a package substrate of the IC package, including, but not limited to, the IC packages FIGS. 3A-4, 6A-8B, and 11A-11G.

DETAILED DESCRIPTION

Figure 1:
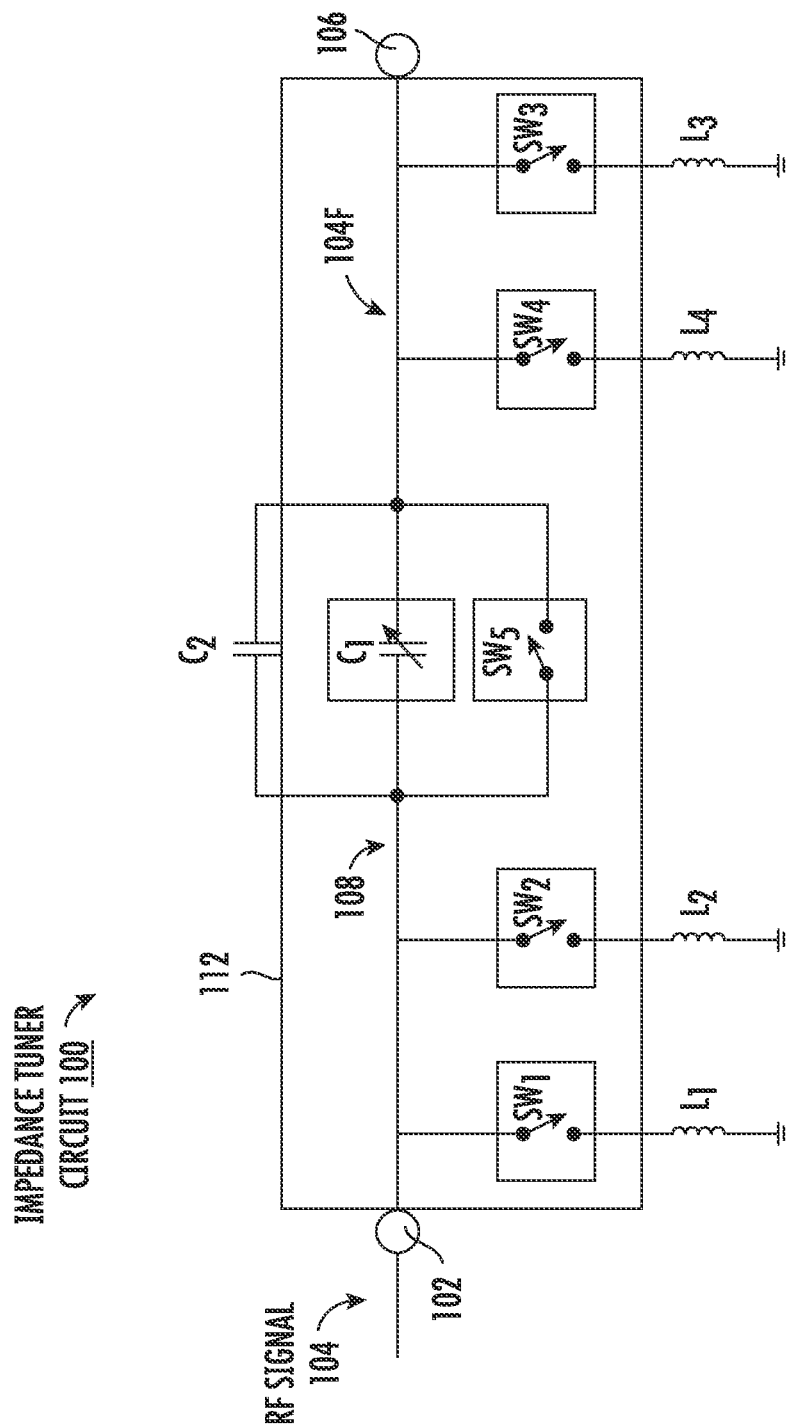
FIG. 1 is a schematic diagram of an exemplary impedance tuner circuit that includes switchable inductors that are programmable to change frequency response of the impedance tuner circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include an integrated circuit (IC) package employing an on-package tunable inductor formed in a redistribution layer (RDL) for an impedance tuner circuit. Related methods are also disclosed. The IC package includes an impedance tuner circuit that includes a tunable inductor that can be tuned to change the frequency response of the impedance tuner circuit. To reduce circuit area needed to provide the tunable inductor, the tunable inductor is integrated in an IC package. In exemplary aspects, the tunable inductor is formed in a RDL of a package substrate of the IC package. The IC package also includes a semiconductor die ("die") that includes other components of the impedance tuner circuit coupled to the tunable inductor by the die being coupled to the package substrate. In this manner, by the tunable inductor being formed in a RDL in the package substrate, the signal path lengths between the tunable inductor and other components of the tunable impedance circuit are reduced, thereby reducing the inductance path resistance and improving the quality (Q) factor of the tunable inductor. Also, by forming the tunable inductor in a RDL of the IC package, the tunable inductor can be formed of the desired geometry to provide the desired inductance frequency response.

In exemplary aspects, the tunable inductor can be formed in the RDL of a package substrate of an IC package as a metal line having a first terminal and second terminal that can be coupled to a circuit to couple the inductance of the tunable inductor to the circuit. The tunable inductor is also formed in the RDL to have one or more shunt taps. A shunt tap is two metal lines formed in the tunable inductor that have ends adjacent to each other, but forming a short circuit. One or more switches in an active semiconductor layer in a front-end-of-line (FEOL) of the die as part of the impedance tuner circuit are coupled to respective shunt taps in the tunable inductor through signal path routing in the package substrate between the die and the tunable inductor in the RDL. The switches in the die can be programmed/controlled to either shunt the shunt tap or leave their respective, coupled shunt tap as an open circuit, to change the inductance of the inductor and shift the frequency response of the impedance tuner circuit. In this manner, the switches allow the inductance of the inductor to be tuned through the controlling of the shunting or not shunting of the one or more shunt taps in the inductor. The tunable inductor being disposed in the RDL in the package substrate of the IC package locates the shunt taps closer to respective switches in the die to reduce inductance path length, thereby reducing resistance and improving inductance Q factor. Also, because the inductor is formed as a metal line in the RDL, the inductor and its shunt taps can be formed in the RDL of the desired geometry and connectivity arrangement as part of fabricating the package substrate, to provide the desired inductance tunability of the inductor.

Figure 2A:
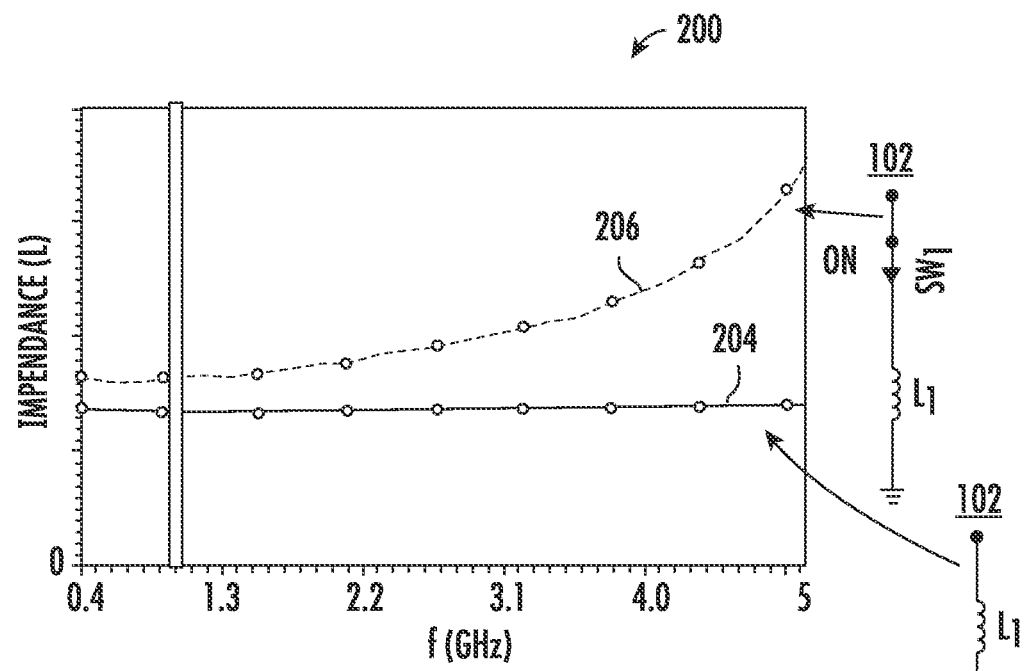
FIGS. 2A and 2B are graphs illustrating inductance and quality (Q) factor as a function of frequency of an inductive path of the impedance tuner circuit in FIG. 1.
Figure 2B:
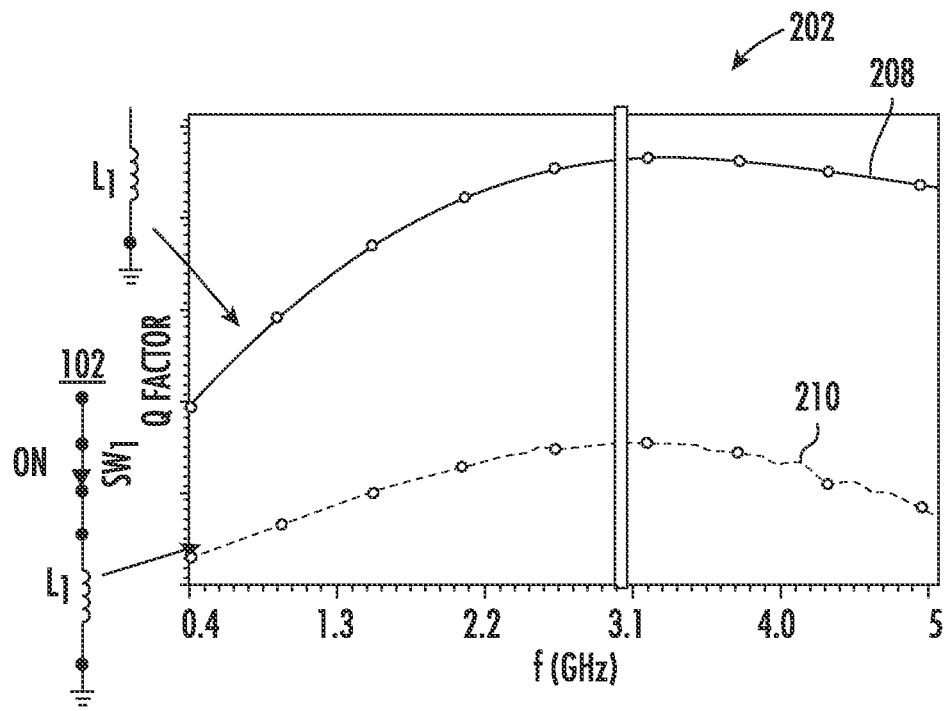
Figure 3A:
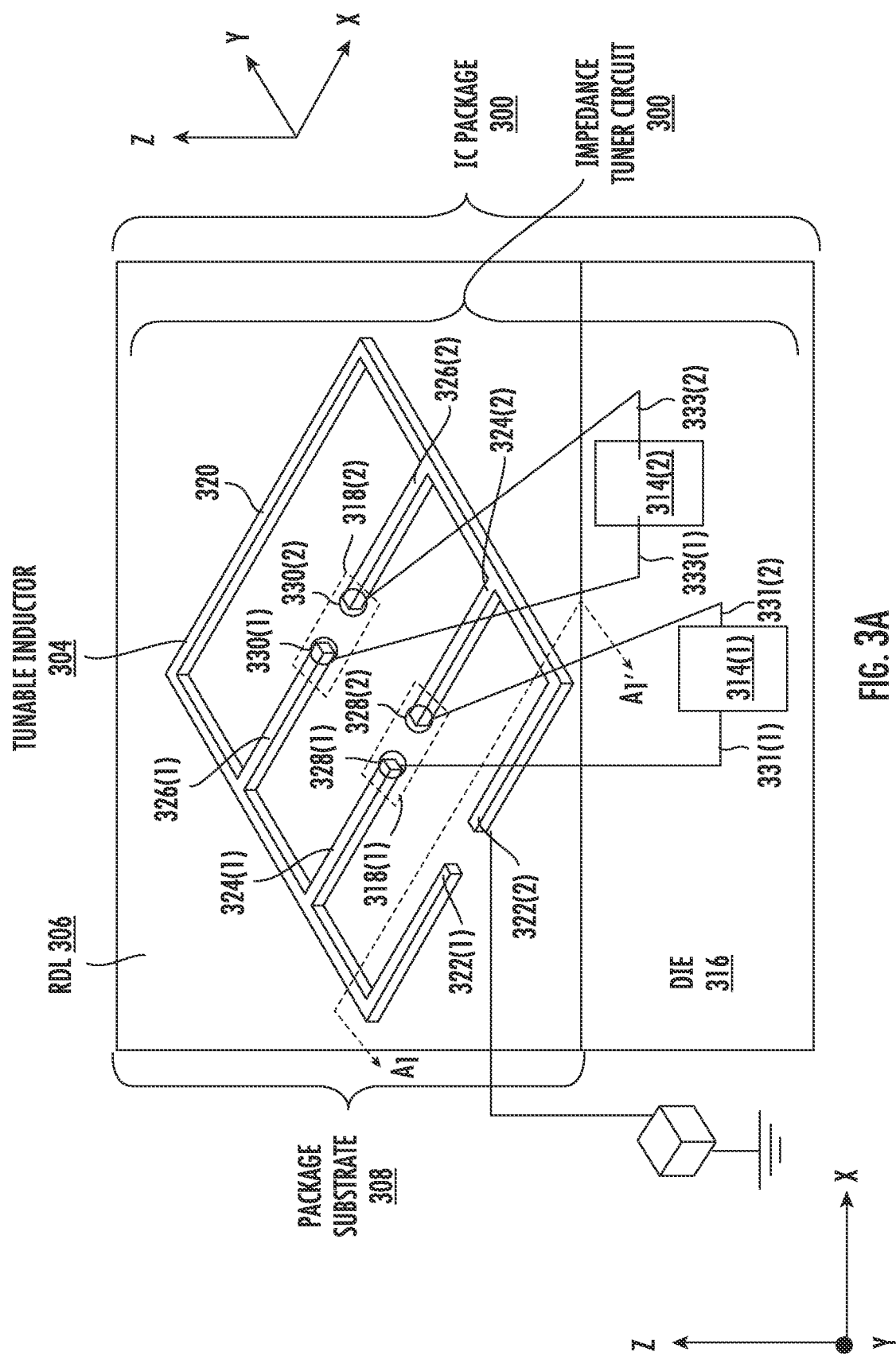
FIGS. 3A and 3B are side views of an integrated circuit (IC) package that includes an impedance tuner circuit that includes a tunable inductor formed in a redistribution layer (RDL) in a package substrate, wherein the tunable inductor includes a plurality of complementary conductive sections that each include ends adjacent to each other to form complementary shunt taps configured to be shunted by respective switches of the impedance tuner circuit in a semiconductor die ("die") coupled to the package substrate.

Before discussing examples of IC packages employing on-package tunable inductors formed in a redistribution layer (RDL) for an impedance tuner circuit starting at FIG. 3A, an exemplary impedance tuner circuit and its performance in FIGS. 1-2B is first described.

In this regard, FIG. 1 is a schematic diagram of an exemplary impedance tuner circuit 100 that can be employed in a RF transceiver circuit. The impedance tuner circuit 100 includes switchable inductors $L_1$-$L_4$ that are each individually selectable through respective switches $SW_1$-$SW_4$ included in the impedance tuner circuit 100 to change frequency response of the impedance tuner circuit 100. As shown in FIG. 1, the impedance tuner circuit 100 includes an input node 102 configured to receive a radio-frequency (RF) signal 104 and an output node 106. The impedance tuner circuit 100 filters the RF signal 104 received on the input node 102 into a filtered RF signal 104F on the output node 106 depending on the selected arrangement of involvement of passive filtering components, including the switchable inductors $L_1$-$L_4$. In this regard, the impedance tuner circuit 100 has a signal path 108 between the input node 102 and the output node 106 that includes a first, variable capacitor $C_1$ connected in series. A second, fixed capacitor $C_2$ is connected in parallel to the first, variable capacitor $C_1$. A switch $S_5$ is connected in parallel to the variable capacitor $C_1$, to the input node 102 and the output node 106. When switch $S_5$ is closed, the input node 102 is shorted to the output node 106, thereby allowing the RF signal 104 to bypass the variable capacitor $C_1$ and fixed capacitor $C_2$. When switch $S_5$ is open, the variable capacitor $C_1$ and fixed capacitor $C_2$ are present in the signal path 108 contributing to the filtering of the RF signal 104 to the filtered RF signal 104F.

With continuing reference to FIG. 1, the impedance tuner circuit 100 includes switches $S_1$-$S_4$ that are connected in series to the inductors $L_1$-$L_4$, between the inductors $L_1$-$L_4$ and the respective input node 102 and output node 106. In this regard, when any of the switches $S_1$-$S_4$ are closed, their respective coupled inductors $L_1$-$L_4$ are connected in parallel to the respective input node 102 and output node 106, thus affecting the filtering of the RF signal 104 into the filtered RF signal 104F. When any of the switches $S_1$-$S_4$ are open, their respective coupled inductors $L_1$-$L_4$ are disconnected to the respective input node 102 and output node 106, thus not affecting the filtering of the RF signal 104 into the filtered RF signal 104F. Thus, the frequency response of the impedance tuner circuit 100 is programmable based on the ability to selectively control the opening or closing of the switches $S_1$-$S_5$.

FIGS. 2A and 2B are graphs 200, 202 illustrating inductance and quality (Q) factor, respectively, as a function of frequency of an inductive path of the inductor $L_1$ in the impedance tuner circuit 100 in FIG. 1. Curve 204 in the graph 200 in FIG. 2A illustrates the inductance (L) on the input node 102 of the impedance tuner circuit 100 from inductor $L_1$ as a function of frequency (f) if switch $SW_1$ were not present and the inductor $L_1$ was directly coupled to the input node 102. Curve 206 in graph 202 in FIG. 2B illustrates the increase in the inductance on the input node 102 as a function of the presence of switch $SW_1$ closed coupling inductor $L_1$ to the input node 102 through switch $SW_1$. Curve 208 in the graph 202 in FIG. 2B illustrates the quality (Q) factor of inductance (L) on the input node 102 of the impedance tuner circuit 100 from inductor $L_1$ as a function of frequency (f) if switch SW were not present and the inductor $L_1$ was directly coupled to the input node 102. Curve 208 in the graph 202 in FIG. 2B illustrates the quality (Q) factor of inductance (L) on the input node 102 of the impedance tuner circuit 100 from inductor $L_1$ as a function of frequency (f) if switch $SW_1$ were not present and the inductor $L_1$ was directly coupled to the input node 102. Curve 210 illustrates the Q factor of inductance (L) on the input node 102 as a function of the presence of switch $SW_1$ being closed and coupling inductor $L_1$ to the input node 102 through switch $SW_1$. Thus, as shown in curve 210 FIG. 2B, the Q factor of impedance on the input node 102 from inductor $L_1$ decreases by the presence of switch $SW_1$ as compared to the Q factor of impedance on the input node 102 from inductor $L_1$ shown in curve 208 when the inductor $L_1$ is directly coupled to the input node 102.

Thus, switch $SW_1$ in the impedance tuner circuit 100 in FIG. 1 provides the capability of selectively coupling or not coupling the inductance from inductor $L_1$ to the input node 102 for tuning the frequency response of the impedance tuner circuit 100. However, the presence of switch $SW_1$ increases the path length between the input node 102 and the inductor $L_1$ that results in reduction of Q factor of inductor $L_1$ on the input node 102 due to the increase in resistance in the inductance path to inductor $L_1$. The inductors $L_1$-$L_4$ in the impedance tuner circuit 100 in FIG. 1 are located external to an IC package 112 that includes the switches $SW_2$-$SW_4$ and other components of the impedance tuner circuit 100 in FIG. 1 due to the size of the inductors $L_1$-$L_4$. Also, the losses in switch $SW_1$ results in reduction of Q factor of inductor $L_1$ on the input node 102. Losses in Q factor of inductors $L_2$-$L_4$ on the respective input node 102 and output node 106 also occur due to the presence of respective switches $SW_2$-$SW_4$ in the impedance tuner circuit 100 in FIG. 1. It is desired to reduce these losses to improve the Q factor of inductance in an impedance tuner circuit, such as the impedance tuner circuit 100 in FIG. 1, without losing the capability of selecting tuning inductance to tune the frequency response of the impedance tuner circuit 100.

Figure 3B:
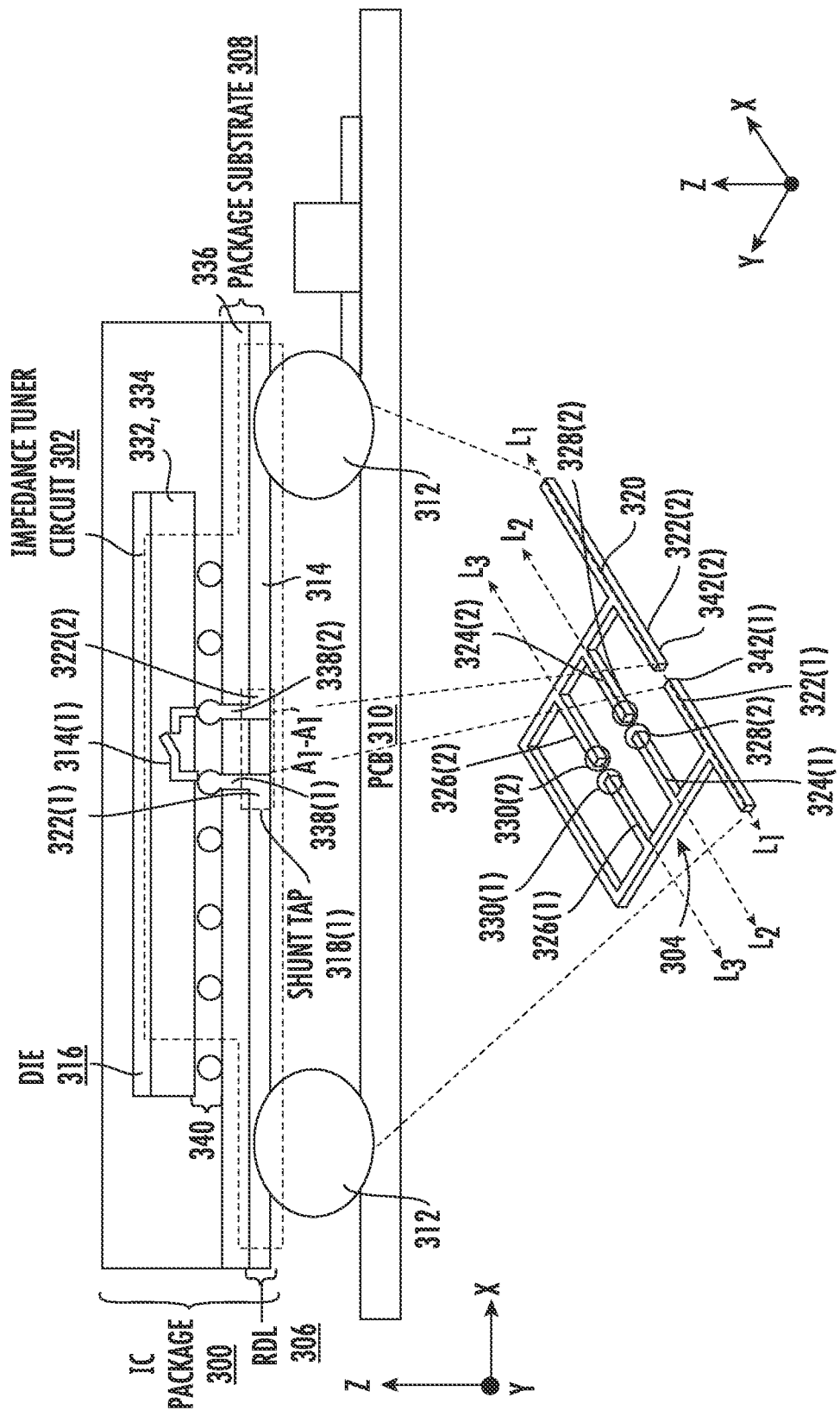

In this regard, FIGS. 3A and 3B are side views of an IC package 300 that includes an impedance tuner circuit 302 that includes a tunable inductor 304 ("inductor 304") formed in a RDL 306 of a package substrate 308. FIG. 3A is a functional diagram of the IC package 300. FIG. 3B is a schematic diagram of a side view of IC package 300 from the cross-section line $A_1$-$A_1'$ in FIG. 3A. As discussed in more detail below, the inductor 304 can be tuned to change the inductance and frequency response of the impedance tuner circuit 302. The inductor 304 is integrated in the IC package 300, and more particularly the RDL 306 of the package substrate 308 of the IC package 300. An RDL can be an extra metallization layer that is formed in a package substrate that includes formed metal lines for redistributing metal pads for making external connections to other locations in a package substrate. The fabrication technology used for forming metal line in a RDL can also be used to form the inductor 304 in the RDL 306 of the package substrate 308 of the IC package 300. As shown in FIG. 3B, by the inductor 304 being formed in the RDL 306 of the package substrate 308 of the IC package 300, the impedance tuner circuit 302 can be completely provided in the IC package 300. The IC package 300 can be coupled to a printed circuit board (PCB) 310 through external interconnects 312 (e.g., solder balls)

coupled to the package substrate 308 to couple the impedance tuner circuit 302 to other circuits coupled to the PCB 310.

With continuing reference to FIGS. 3A and 3B, as also discussed in more detail below, the inductor 304 in the RDL 306 of the package substrate 308 is coupled to switches 314(1), 314(2) formed in a die 316 of the IC package 300. FIG. 3B only shows switch 314(1) among the switches 314(1), 314(2) shown in FIG. 3A, according to the side view along the cross-section line $A_1$-$A_1'$ in FIG. 3B. The opening and closing of the switches 314(1), 314(2) are controllable to selectively shunt or not shunt respective shunt taps 318(1), 318(2) formed in the inductor 304 to shift the inductance frequency response of the impedance tuner circuit 302. In this example, two shunt taps 318(1), 318(2) are formed in the inductor 304, but note that one (1) or more than two (2) shunt taps could be formed in the inductor 304. The number of shunt taps formed in the inductor 304 affects the number of programmable settings for shifting the inductance frequency response inductance of the inductor 304. In this manner, by the inductor 304 being formed in the RDL 306 of the package substrate 308 of the IC package 300, the signal path lengths between the inductor 304 and the respective switches 314(1), 314(2) are reduced, thereby reducing the inductance path resistance of the shunt taps 318(1), 318(2) and improving the Q factor of the inductor 304. Also, as discussed in more detail below, by forming the inductor 304 in the RDL 306 of the IC package 300, the inductor 304 can be formed of the desired geometry to provide the desired inductance frequency response. In this example, because the inductor 304 is formed in a single RDL 306 of the IC package 300, the inductor 304 is a two-dimensional (2D) inductor 304.

With continuing reference to FIGS. 3A and 3B, in this example, the inductor 304 formed in the RDL 306 of the package substrate 308 of the IC package 300 is formed as a metal line 320 having a first terminal 322(1) and second terminal 322(2) that are coupled to the impedance tuner circuit 100. The shunt taps 318(1), 318(2) are both coupled in parallel to the first and second terminals 322(1), 322(2). The shunt taps 318(1), 318(2) are each formed of two (2) respective shunt metal lines 324(1)-324(2), 326(1)-326(2) formed in the inductor 304 and that have first and second ends 328(1)-328(2) and first and second ends 330(1)-330(2) adjacent to each other, but forming a short circuit. As shown in FIG. 3A, the switches 314(1), 314(2) in an active semiconductor layer 332 in a front-end-of-line (FEOL) 334 of the die 316 as part of the impedance tuner circuit 302 are coupled to respective ends 328(1)-328(2), 330(1)-330(2) of the respective shunt taps 318(1), 318(2) in the inductor 304. The switches 314(1), 314(2) each include respective first and second switch terminals 331(1)-331(2), 333(1), 333(2) that are coupled to respective first and second ends 328(1)-328(2) and first and second ends 330(1)-330(2) of the respective shunt taps 318(1)-318(2). As shown in FIGS. 3A and 3B, the switches 314(1), 314(2) are coupled to the respective ends 328(1)-328(2), 330(1)-330(2) of the respective shunt taps 318(1), 318(2) through signal path routing in the package substrate 308 between the die 316 and the inductor 304 in the RDL 306. In this example, as shown in FIG. 3B, the package substrate 308 includes a metallization layer 336 that is adjacent to the RDL 306 and disposed between the RDL 306 and the die 316 in a vertical direction (Z-axis direction). The metallization layer 336 includes metal interconnects that are located behind the metal interconnects 338(1), 338(2) in the Y-axis direction that are coupled to the respective ends 328(1)-328(2), 330(1)-330(2) of the respective shunt taps 318(1), 318(2) and to die interconnects 340 of the die 316 that are coupled to respective switches 314(1), 314(2), to couple the shunt taps 318(1), 318(2) of the inductor 304 to the switches 314(1), 314(2).

In this manner, as shown in FIGS. 3A and 3B, the switches 314(1), 314(2) in the die 316 can be programmed/controlled to either shunt the shunt taps 318(1), 318(2) or leave their respective, coupled shunt taps 318(1), 318(2) as an open circuit, or a mixture thereof, to shift the inductance of the inductor 304 and its inductance frequency response in the impedance tuner circuit 302. In this manner, the switches 314(1), 314(2) allow the inductance of the inductor 304 to be tuned through the controlling of the shunting or not shunting of the one or more shunt taps 318(1), 318(2) in the inductor 304. The inductor 304 being disposed in the RDL 306 in the package substrate 308 of the IC package 300 locates the shunt taps 318(1), 318(2) closer to respective switches 314(1), 314(2) in the die 316 to reduce inductance path length, thereby reducing resistance and improving inductance Q factor of the inductor 304. Also, because the inductor 304 is formed as a metal line 320 in the RDL 306, the inductor 304 and its shunt taps 318($l$), 318(2) can be formed in the RDL 306 of the desired geometry and connectivity arrangement as part of fabricating the package substrate 308, to provide the desired inductance tunability of the inductor 304.

Note that metal lines 342(1), 324(2) in the inductor 304 could be classified as a shunt tap wherein a switch coupled be coupled to the metal lines 342(1), 342(2) to control the shunting of the metal lines 342(1), 342(2). The shunting of the inductor 304 can be controlled depending on the circuit in which the inductor 304 is included, to control inductance while having a two (2) terminal connection to the circuit. Note that as shown in FIG. 3A, the first and second terminals 322(1), 322(2) are formed in respective metal lines 342(1), 342(2) that extend along longitudinal axis $L_1$ in the X-axis direction. The shunt taps 318(1), 318(2) each extend along longitudinal axes $L_2$, $L_3$ that are parallel to the longitudinal axis $L_1$. However, as discussed in other examples of tunable inductors below, shunt taps in a tunable inductor may extend in non-parallel axes to the metal lines in which the first and second terminals of the tunable inductor are formed.

Figure 4:
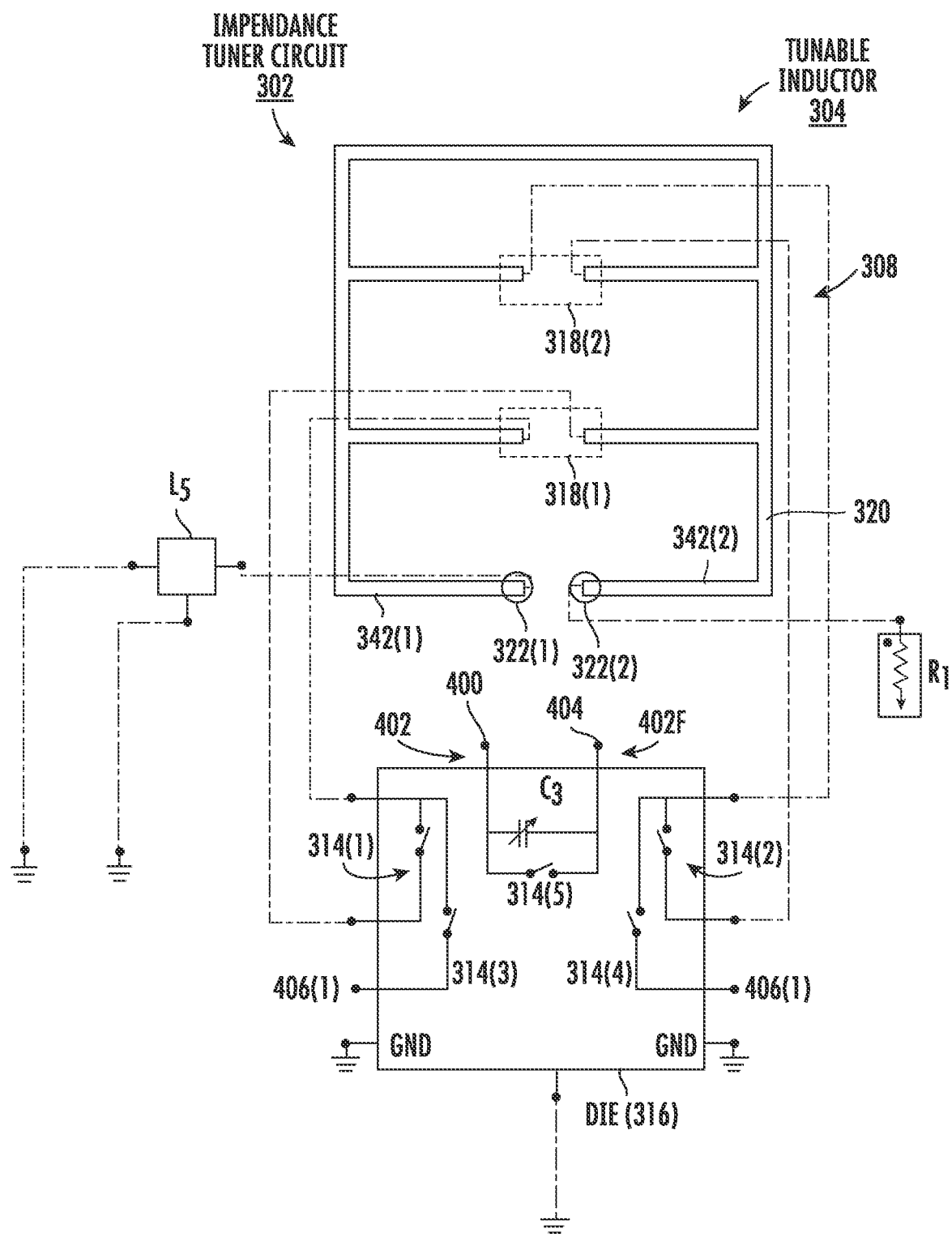
FIG. 4 is a circuit diagram of an exemplary impedance tuner circuit that can be provided in the IC package in FIGS. 3A and 3B.

FIG. 4 is a circuit diagram of the impedance tuner circuit 302 that includes the inductor 304 in the IC package 300 in FIGS. 3A and 3B. As shown in FIG. 4, the impedance tuner circuit 302 includes an input node 400 configured to receive a RF signal 402 and an output node 404 configured to provide a filtered RF signal 402F. The die 316 includes switches 314(1), 314(2) as part of the impedance tuner circuit 302 that are coupled to the respective shunt taps 318(1), 318(2) of the tunable inductor 304 in the package substrate 308. An optional external inductor $L_5$ is coupled to the first terminal 322(1). An optional resistor $R_1$ is coupled to the second terminal 322(2) of the inductor 304. Switch 314(3) is coupled to the shunt tap 318(1) and a first node 406(1). Switch 314(4) is coupled to the shunt tap 318(2) and a second node 406(2). The switches 314(1), 314(2) can be controlled to be open or closed to either not shunt or shunt the respective shunt taps 318(1), 318(2) in the inductor 304 to shift the inductance frequency response of the inductor 304. The impedance tuner circuit 302 also includes a variable capacitor $C_3$ that is configured to be selectively coupled in series or bypass between the input node 400 and the output node 404.

Figure 5A:
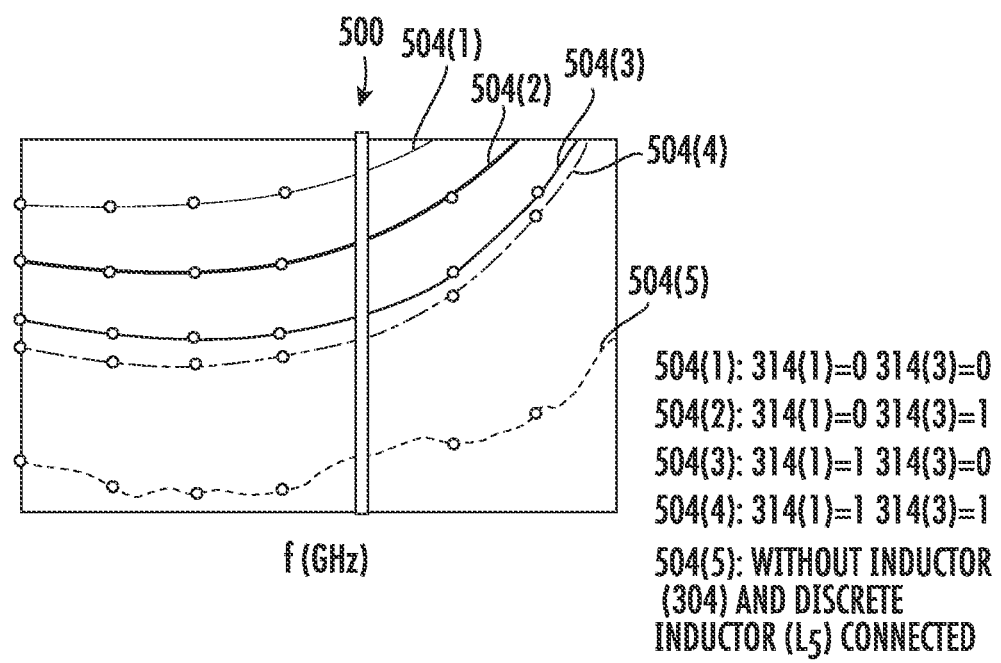
FIGS. 5A and 5B are graphs illustrating inductance and Q factor as a function of frequency of an inductive path of the impedance tuner circuit in the IC package in FIGS. 3A and 3B.
Figure 5B:
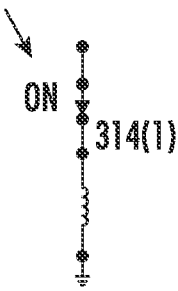
Figure 5B:
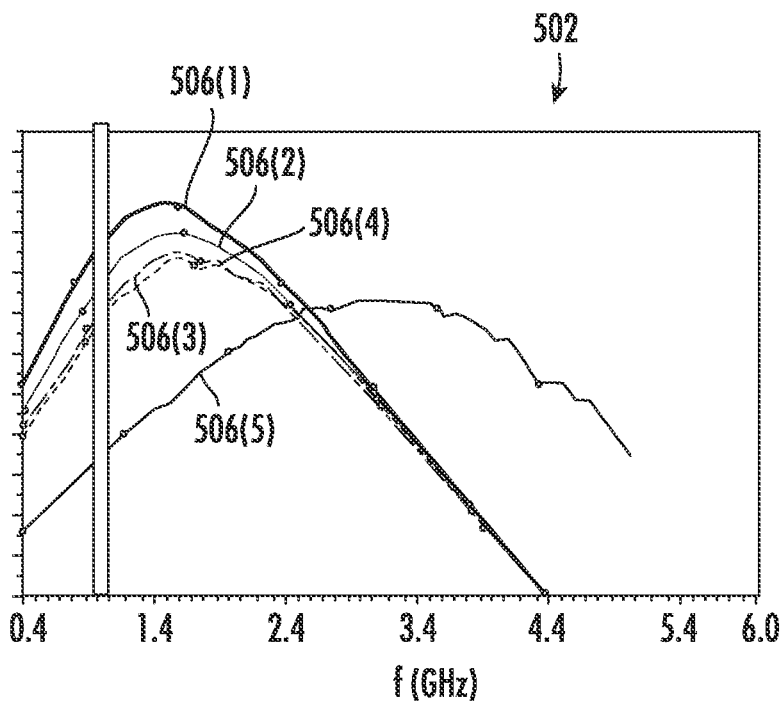

FIGS. 5A and 5B are graphs 500, 502 illustrating inductance and Q factor, respectively, as a function of frequency of an inductive path of the inductor 304 in the impedance tuner circuit 302 in FIGS. 3A-4. Curves 504(1)-504(4) in the graph 500 in FIG. 5A illustrates the inductance (L) of the impedance tuner circuit 302 in FIG. 4 as a function of frequency based on ('1') and off ('0') combinations of switches 314(1), 314(2) coupled to the shunt taps 318(1), 318(2) as shown. As shown in FIG. 5A, the controlling of the switches 314(1), 314(2) in different on/off states shifts the inductance (L) of the impedance tuner circuit 302. Curve 504(5) in the graph 500 in FIG. 5A illustrates the inductance (L) on the input node 400 of the impedance tuner circuit 302 in FIG. 4 as a function of frequency based only inductor $L_5$ without the presence of inductor 304.

Curves 506(1)-506(4) in graph 502 in FIG. 5B illustrate the Q factor of inductance (L) of the impedance tuner circuit 100 from inductor 304 as a function of frequency (f) based on the same on ('1') and off ('0') combinations of switches 314(1), 314(2) that are related to respective inductance curves 504(1)-504(4) in FIG. 2A. As shown in FIG. 5B, the controlling of the switches 314(1), 314(2) in different on/off states shifts the inductance (L) of the impedance tuner circuit 302. Curve 506(5) in the graph 502 in FIG. 5B illustrates the Q factor of inductance (L) of the impedance tuner circuit 302 in FIG. 4 as a function of frequency based only inductor $L_5$ without the presence of inductor 304. Note that the Q factor is higher in curves 506(1)-506(4) than curve 506(5).

Figure 6A:
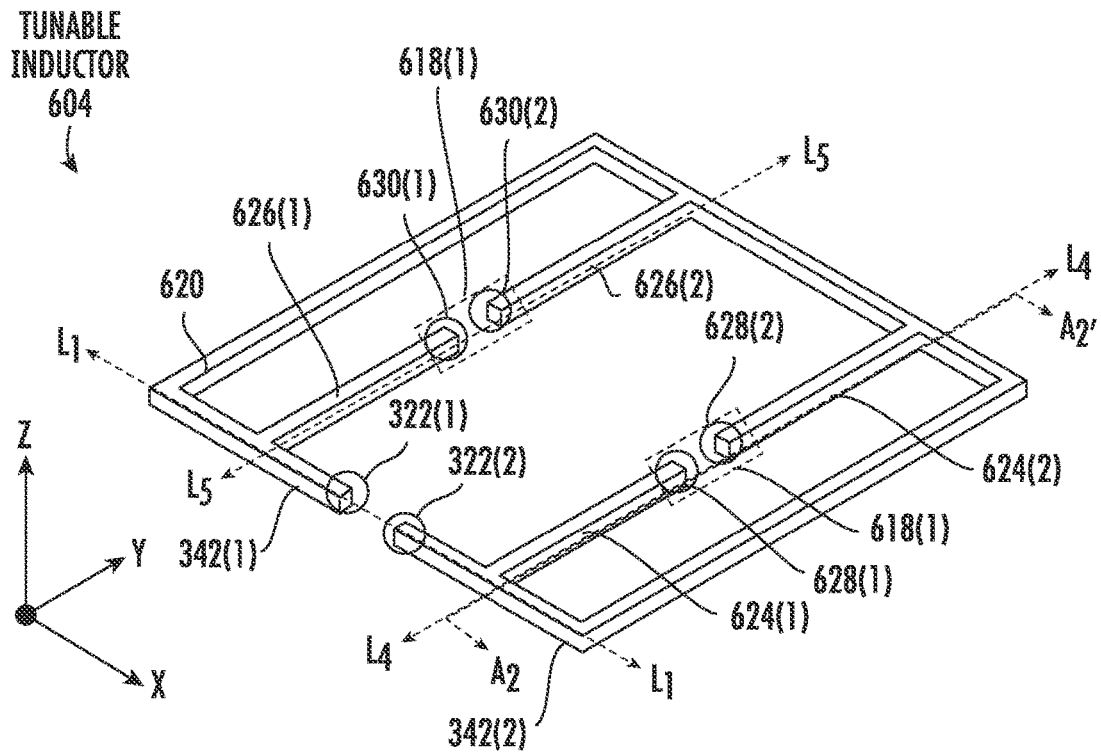
FIG. 6A is a perspective view of another exemplary two-dimensional (2D) tunable inductor that can be formed in a RDL of an IC package.
Figure 6B:
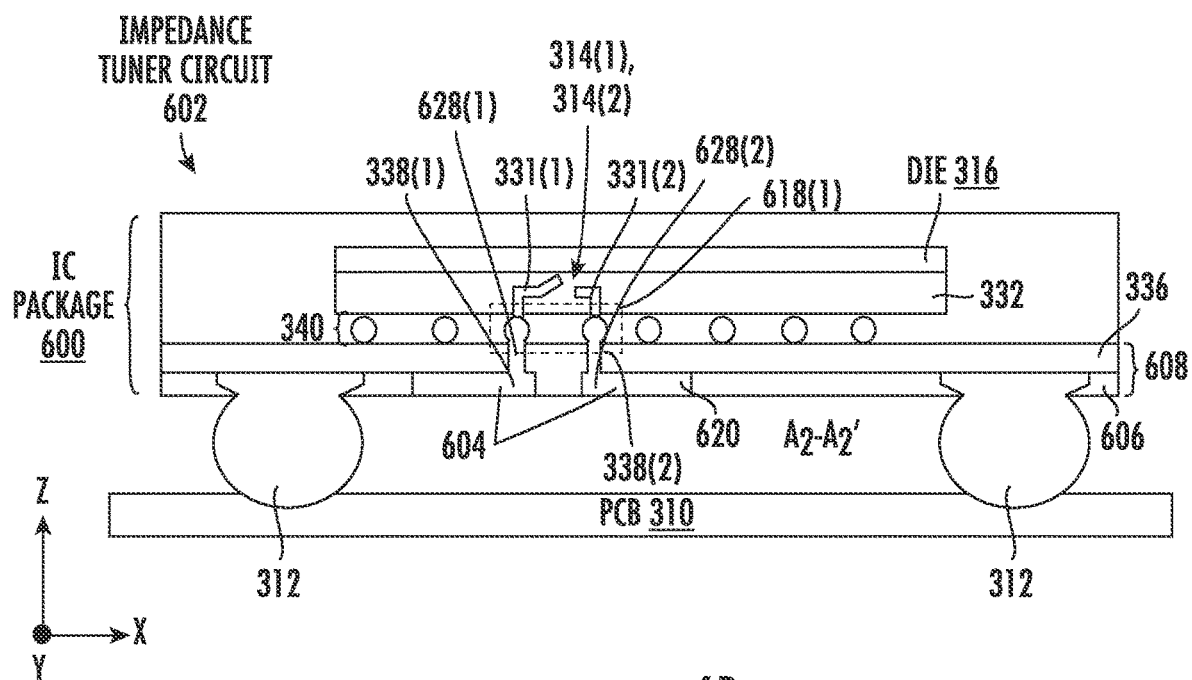
FIG. 6B is a side view of another exemplary IC package that includes an impedance tuner circuit that includes the tunable inductor in FIG. 6A.

FIG. 6A is a perspective view of another exemplary 2D tunable inductor 604 ("inductor 604") that can be formed in a RDL of an IC package. FIG. 6B is a side view of another exemplary IC package 600 that includes an impedance tuner circuit 602 similar to the impedance tuner circuit 302 in the IC package 300 in FIG. 3B. The IC package 600 in FIG. 6B includes a RDL 606 that includes the inductor 604 in FIG. 6A. FIG. 6B is a schematic diagram of a side view IC package 600 from the cross-section line $A_2$-$A_2$' in the inductor 604 in FIG. 6A. Common elements between the IC package 300 in FIG. 3B and the IC package 600 in FIG. 6B are shown with common element numbers and not re-described. Note that as shown in FIG. 6A, like the inductor 304 in FIGS. 3A and 3B, the first and second terminals 322(1), 322(2) of the inductor 604 are formed in respective metal lines 342(1), 342(2) that extend along the longitudinal axis $L_1$ in the X-axis direction. However, as also shown in FIG. 6A, in this example of inductor 604, its shunt taps 618(1), 618(2) each extend along longitudinal axes longitudinal axes $L_4$, $L_5$ that are orthogonal to the longitudinal axis $L_1$ as opposed to parallel like in the inductor 304 in FIGS. 3A and 3B.

With reference to FIGS. 6A and 6B, the inductor 604 in the RDL 606 of the package substrate 608 is coupled to switches 314(1), 314(2) formed in the die 316 of the IC package 600. FIG. 6B only shows a diagram of switch 314(1) among the switches 314(1), 314(2) shown in FIG. 3A, according to the side view along the cross-section line $A_2$-$A_2$' in the inductor 604 in FIG. 6B. The opening and closing of the switches 314(1), 314(2) are controllable to selectively shunt or not shunt respective shunt taps 618(1), 618(2) formed in the inductor 604 to shift the inductance frequency response of the impedance tuner circuit 302.

As shown in FIG. 6A, the inductor 604 formed in the RDL 606 of the package substrate 608 of the IC package 600 is formed as a metal line 620 having the first terminal 322(1) and second terminal 322(2) that is coupled to the impedance tuner circuit 602. The shunt taps 618(1), 618(2) are both coupled in series to the first and second terminals 322(1), 322(2) in this example. The shunt taps 618(1), 618(2) are each formed of two (2) respective shunt metal lines 624(1)-624(2), 626(1)-626(2) formed in the inductor 604 and have first and second ends 628(1)-628(2) and first and second ends 630(1)-630(2) adjacent to each other, but forming a short circuit. The switches 314(1), 314(2) are coupled to the respective ends 628(1)-628(2), 630(1)-630(2) of the respective shunt taps 618(1), 618(2) through signal path routing in the package substrate 608 between the die 316 and the inductor 604 in the RDL 606. The switches 314(1), 314(2) in the die 316 can be programmed/controlled to either shunt the shunt taps 618(1), 618(2) or leave their respective, coupled shunt taps 618(1), 618(2) as an open circuit, or a mixture thereof, to shift the inductance of the inductor 604 and its inductance frequency response in an impedance tuner circuit 602.

Note that like the inductor 304 in FIGS. 3A and 3B, the metal lines 342(l), 324(2) in the inductor 604 could be classified as a shunt tap wherein a switch coupled be coupled to the metal lines 342(1), 342(2) to control the shunting of the metal lines 342(1), 342(2). The shunting of the inductor 604 can be controlled depending on the circuit in which the inductor 604 is included, to control inductance while having a two (2) terminal connection to the circuit.

Figure 7A:
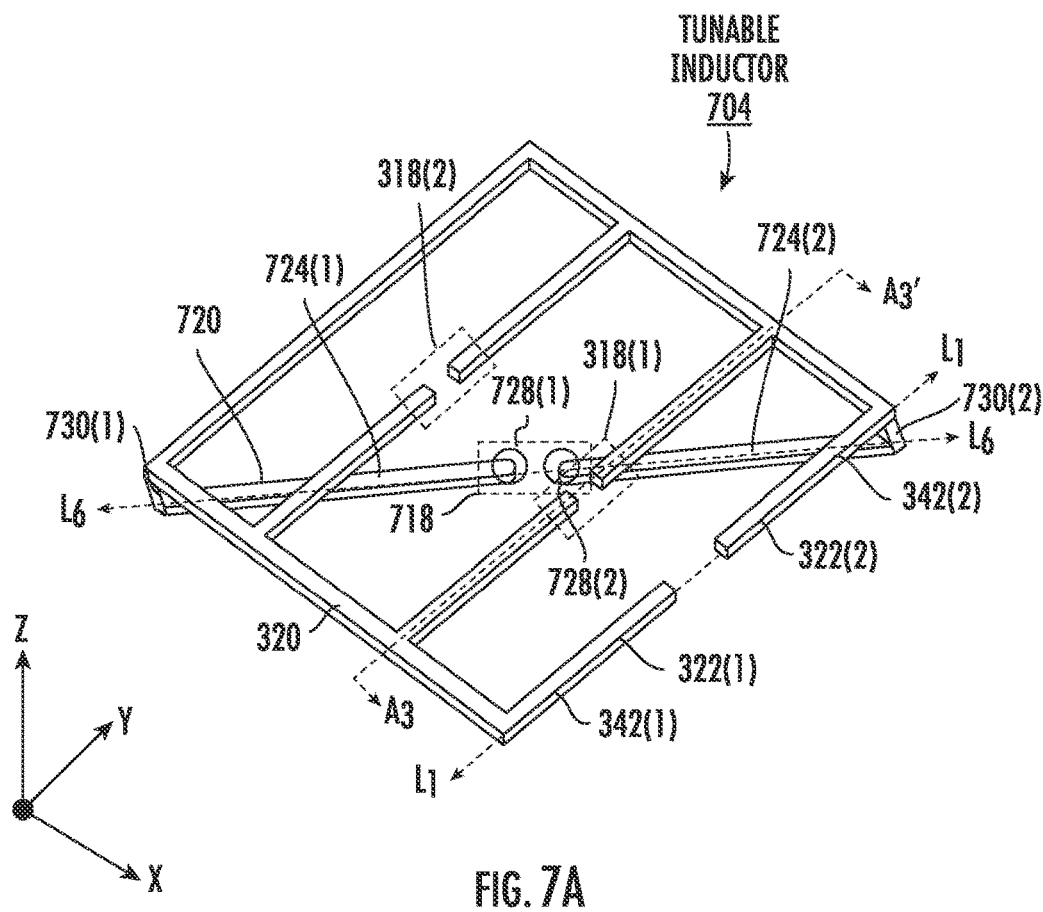
FIG. 7A is a perspective view of another exemplary three-dimensional (3D) tunable inductor that can be formed in multiple RDLs of an IC package.
Figure 7B:
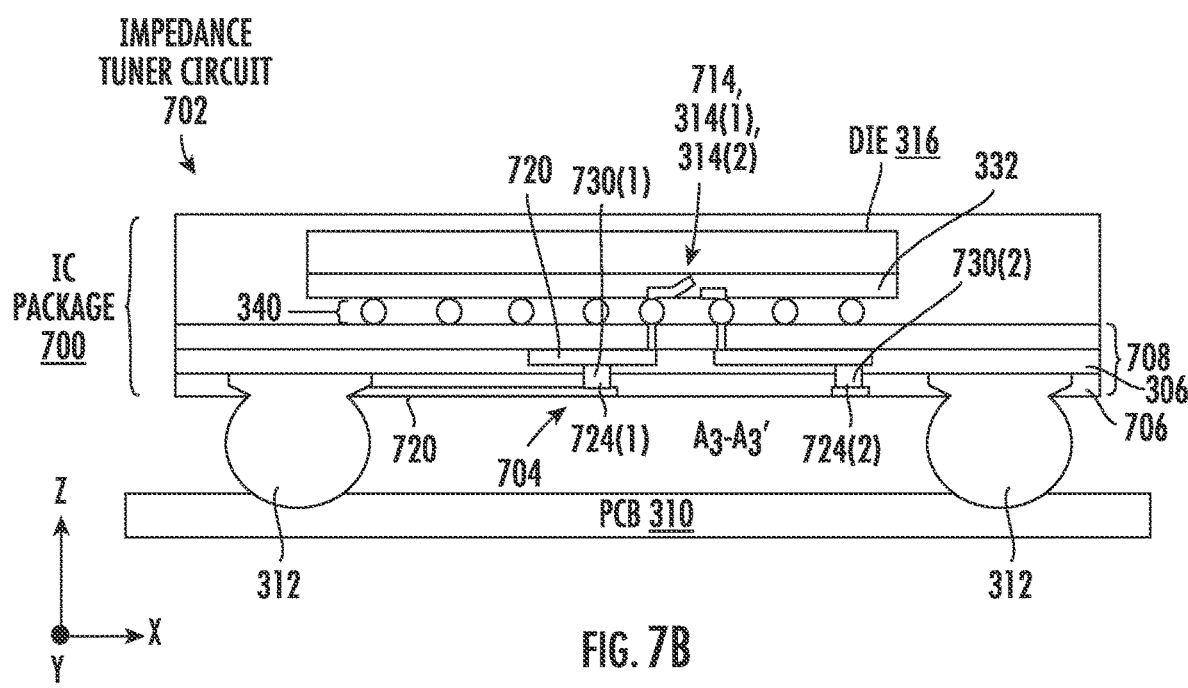
FIG. 7B is a side view of another exemplary IC package that includes an impedance tuner circuit that includes the tunable inductor in FIG. 7A.

FIG. 7A is a perspective view of an exemplary 3D tunable inductor 704 ("inductor 704") that can be formed in multiple RDLs of an IC package. FIG. 7B is a side view of another exemplary IC package 700 that includes an impedance tuner circuit 702 similar to the impedance tuner circuit 302 in the IC package 300 in FIG. 3B. The IC package 700 in FIG. 7B includes RDL 306 and an additional RDL 706 that includes the inductor 704 in FIG. 7A. FIG. 7B is a schematic diagram of a side view IC package 700 from the cross-section line $A_3$-$A_3$' in the inductor 704 in FIG. 7A. Common elements between the IC package 700 in FIG. 7B and the IC package 300 in FIG. 3B are shown with common element numbers and not re-described. The inductor 704 in FIG. 7A is similar to the inductor 304 in FIGS. 3A and 3B. However, as discussed below and shown in FIGS. 7A and 7B, the inductor 704 also includes an additional shunt tap 718 that is disposed in a second RDL 706 adjacent to the first RDL 306 in the package substrate 708 of the IC package 700. Also, as also shown in FIG. 7A, in this example of inductor 704, the shunt tap 718 disposed in the second RDL 706 extend along longitudinal axis $L_6$ that intersects the longitudinal axis $L_1$ of the first and second terminals 322(1), 322(2).

With reference to FIGS. 7A and 7B, the inductor 704 in the RDLs 306, 706 of the package substrate 708 is coupled to switches 314(1), 314(2) formed in the die 316 of the IC package 700. FIG. 7B only shows switch 314(1) among the switches 314(1), 314(2), according to the side view along the cross-section line $A_3$-$A_3$' in the inductor 704 in FIG. 7B. An additional switch 714 disposed in the die 316 is coupled to third shunt tap 718 of the inductor 704. The opening and closing of the switches 314(1), 314(2), 714 are controllable to selectively shunt or not shunt respective shunt taps 318(1), 318(2), 718 formed in the inductor 704 to shift the inductance frequency response of the impedance tuner circuit 702.

As shown in FIG. 7A, the inductor 704 formed in the RDLs 306, 706 of the package substrate 708 of the IC package 700 is formed as respective metal line 320 having the first terminal 322(1) and second terminal 322(2) and metal line 720 that is coupled to the impedance tuner circuit 702. The shunt tap 718 is coupled in parallel to the first and second terminals 322(1), 322(2) of the inductor 704 in this example. The shunt tap 718 is formed of two (2) shunt metal lines 724(1), 724(2) formed in the inductor 704 and that have first and second ends 728(1), 728(2) adjacent to each other, but forming a short circuit. Vias 730(1), 730(2) couple the respective first and second ends 728(1), 728(2) of the shunt tap 718 to the respective first and second terminals 322(1), 322(2). The switch 714 is coupled to the respective ends 728(1), 728(2) of the shunt tap 718 through signal path routing in the package substrate 708 between the die 316 and the inductor 704 in the first and second RDLs 306, 706. The switches 314(1), 314(2), 714 in the die 316 can be programmed/controlled to either shunt the shunt taps 318(1), 318(2), 718 or leave their respective, coupled shunt taps 318(1), 318(2), 718 as an open circuit, or a mixture thereof, to shift the inductance of the inductor 704 and its inductance frequency response in an impedance tuner circuit 702.

Note that metal lines 342(1), 324(2) in the inductor 704 could be classified as a shunt tap wherein a switch coupled be coupled to the metal lines 342(1), 342(2) to control the shunting of the metal lines 342(1), 342(2). The shunting of the inductor 704 can be controlled depending on the circuit in which the inductor 704 is included, to control inductance while having a two (2) terminal connection to the circuit.

Figure 8A:
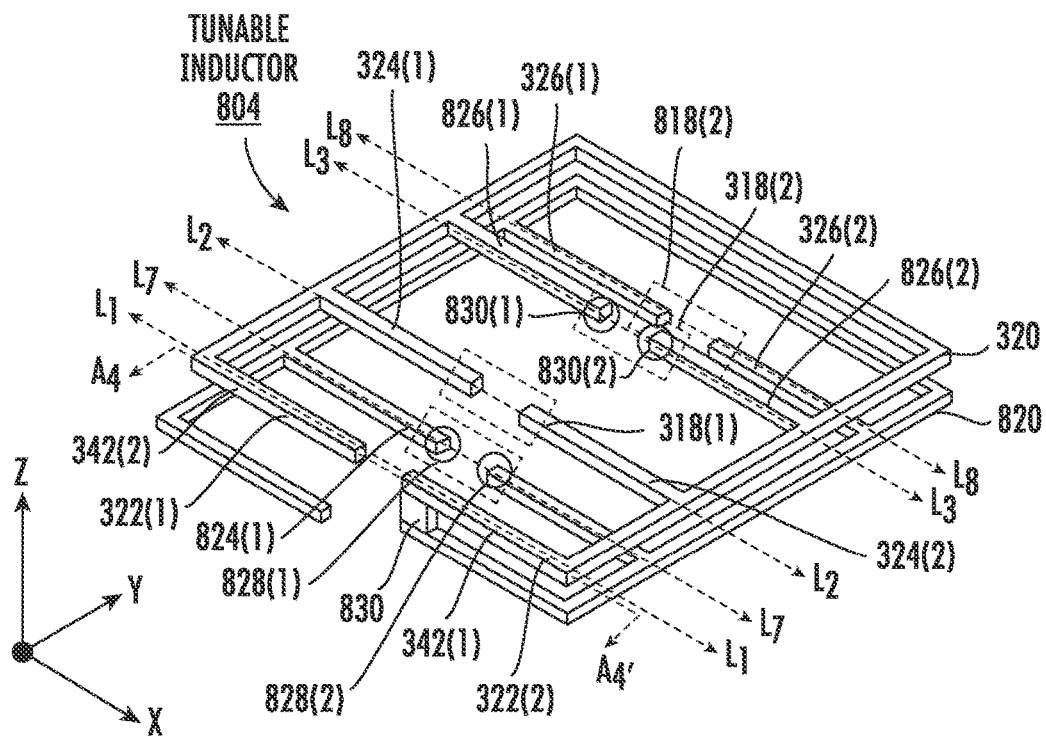
FIG. 8A is a perspective view of another exemplary 3D tunable inductor that can be formed in multiple RDLs of an IC package.
Figure 8B:
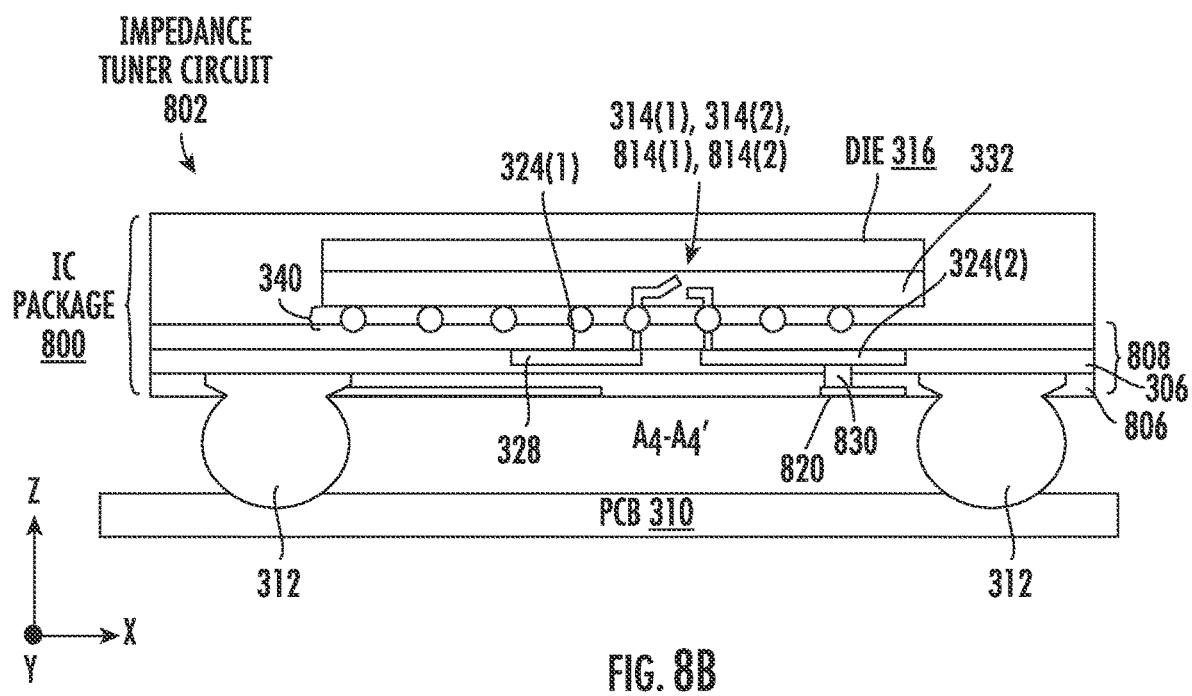
FIG. 8B is a side view of another exemplary IC package that includes an impedance tuner circuit that includes the tunable inductor in FIG. 8A.

FIG. 8A is a perspective view of another exemplary 3D tunable inductor 804 ("inductor 804") that can be formed in multiple RDLs of an IC package. FIG. 8B is a side view of another exemplary IC package 800 that includes an impedance tuner circuit 802 similar to the impedance tuner circuit 302 in the IC package 700 in FIG. 7B. The IC package 800 in FIG. 8B includes RDL 306, and an additional RDL 806 that includes the inductor 804 in FIG. 8A. FIG. 8B is a schematic diagram of a side view IC package 800 from the cross-section line A₄-A₄' in the inductor 804 in FIG. 8A. Common elements between the IC package 800 in FIG. 8B and the IC packages 300, 700 in FIGS. 3B and 7B are shown with common element numbers and not re-described. The inductor 804 in FIG. 8A is similar to the inductors 304, 704 in FIGS. 3B and 7B. However, as discussed below and shown in FIGS. 8A and 8B, the inductor 804 also includes two additional shunt taps 818(1), 818(2) that are both disposed in the second RDL 806 adjacent to the first RDL 306 in the package substrate 808 of the IC package 800. Also, as also shown in FIG. 8A, in this example of inductor 804, the shunt taps 818(1), 818(2) disposed in the second RDL 806 extend along longitudinal axes longitudinal axis $L_7$, $L_8$ that are parallel to longitudinal axis $L_7$, $L_8$ of the shunt taps 318(1), 318(2).

With reference to FIGS. 8A and 8B, the inductor 804 in the RDLs 306, 806 of the package substrate 808 is coupled to switches 314(1), 314(2), 814(1), 814(2) formed in the die 316 of the IC package 800. FIG. 7B only shows switch 314(1) among the switches 314(1), 314(2), 814(1), 814(2) according to the side view along the cross-section line A₄-A₄' in the inductor 804 in FIG. 8B. Switches 814(1), 814(2) disposed in the die 316 are coupled to third and fourth shunt taps 818(1), 818(2) of the inductor 804 in the second RDL 806. The opening and closing of the switches 314(1), 314(2), 814(1), 814(2) are controllable to selectively shunt or not shunt respective shunt taps 318(1), 318(2), 818(1), 818(2) formed in the inductor 804 to shift the inductance frequency response of the impedance tuner circuit 802.

As shown in FIG. 8A, the inductor 804 formed in the RDLs 306, 806 of the package substrate 808 of the IC package 800 is formed as the metal line 320 having the first terminal 322(1) and second terminal 322(2) and a metal line 820 that is coupled to the impedance tuner circuit 802. The shunt taps 818(1), 818(2) are coupled in parallel to the first and second terminals 322(1), 322(2) of the inductor 804 in this example. The shunt taps 818(1), 818(2) are formed of two (2) respective shunt metal lines 824(1)-824(2), 826(1)-826(2) formed in the inductor 804 and that have first and second ends 828(1)-828(2), 830(1)-830(2) adjacent to each other, but forming a short circuit. A via 830 couples the respective first terminals 322(1) to the metal line 820 in the second RDL 806. The switches 814(1), 814(2) are coupled to the respective ends 828(1)-828(2), 830(1)-830(2) of the respective shunt taps 818(1), 818(2) through signal path routing in the package substrate 808 between the die 316 and the inductor 804 in the first and second RDLs 306, 806. The switches 314(1), 314(2), 814(1), 814(2) in the die 316 can be programmed/controlled to either shunt the shunt taps 318(1), 318(2), 818(1), 818(2) or leave their respective, coupled shunt taps 318(1), 318(2), 818(1), 818(2) as an open circuit, or a mixture thereof, to shift the inductance of the inductor 804 and its inductance frequency response in an impedance tuner circuit 802.

Note that metal lines 342(1), 324(2) in the inductor 804 could be classified as a shunt tap wherein a switch coupled be coupled to the metal lines 342(1), 342(2) to control the shunting of the metal lines 342(1), 342(2). The shunting of the inductor 804 can be controlled depending on the circuit in which the inductor 804 is included, to control inductance while having a two (2) terminal connection to the circuit.

Figure 9:
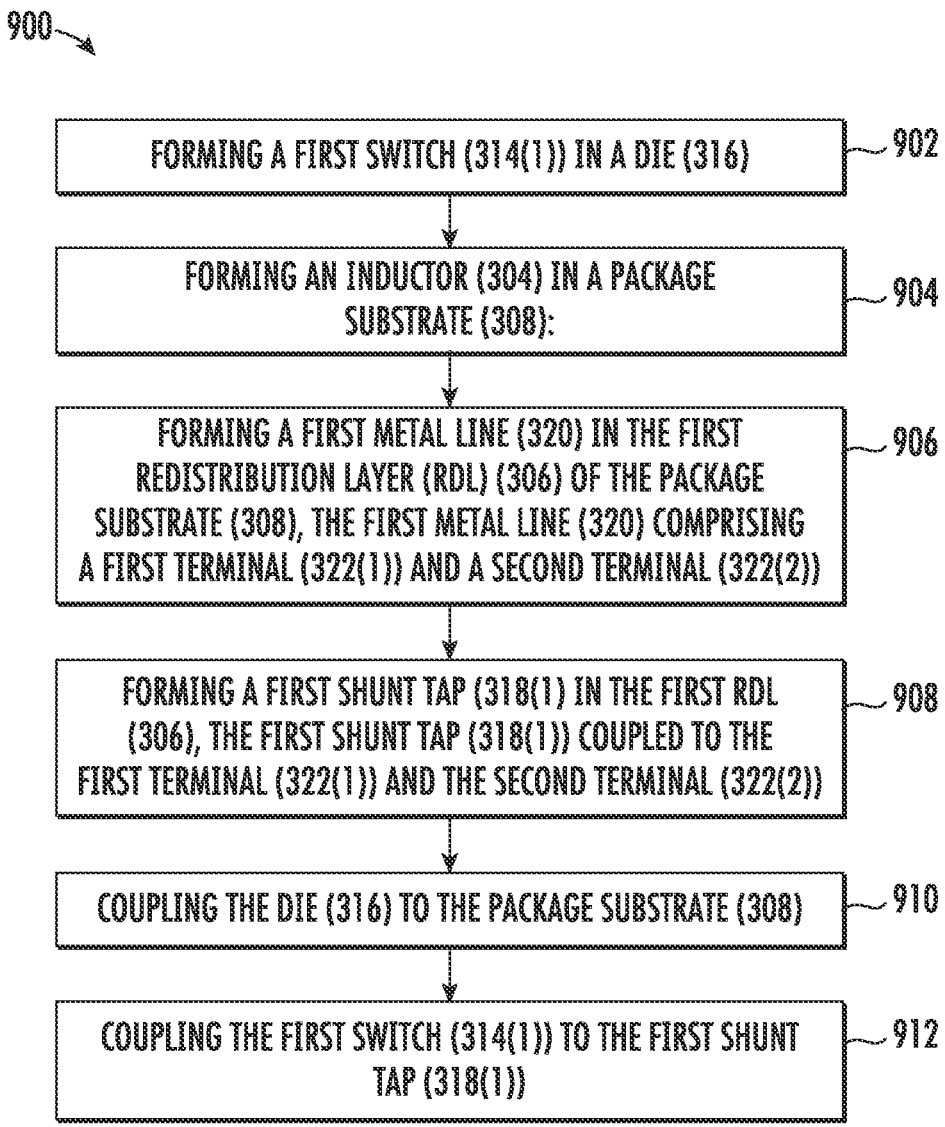
FIG. 9 is a flowchart illustrating an exemplary process of fabricating an IC package that includes an impedance tuner circuit that includes a tunable inductor formed in a RDL of a package substrate, wherein the tunable inductor includes one or more shunt taps configured to be shunted by respective switches of the impedance tuner circuit in a die coupled to the package substrate.

FIG. 9 is a flowchart illustrating an exemplary fabrication process 900 of fabricating an IC package that includes an impedance tuner circuit that includes the tunable formed in a RDL of a package substrate. The tunable inductor includes one or more shunt taps configured to be shunted by respective switches disposed in a die coupled to the package substrate. The process 900 is discussed below with regard to the IC package 300 in FIGS. 3A and 3B, but note that the process 900 is not limited to the IC package 300 in FIGS. 3A and 3B. The process 900 in FIG. 9 can be employed to fabricate the IC packages 600, 700, and 800 in FIGS. 6A-8B, respectively.

In this regard, as shown in FIG. 9, a first step of the fabrication process 900 is forming a first switch 314(1) in a die 316 (block 902 in FIG. 9). A next step in the fabrication process 900 is forming an inductor 304 in a package substrate 308 (block 904 in FIG. 9). Forming the inductor 304 can include the steps of forming a first metal line 320 in the RDL 306 of the package substrate 308, the first metal line 320 comprising a first terminal 322(1) and a second terminal 322(2) (block 906 in FIG. 9), and forming a first shunt tap 318(1) in the RDL 306, the first shunt tap 318(1) coupled to the first terminal 322(1) and the second terminal 322(2) (block 908 in FIG. 9). A next step in the fabrication process 900 is coupling the die 316 to the package substrate 308 (block 910 in FIG. 9). A next step in the fabrication process 900 is coupling the first switch 314(1) to the first shunt tap 318(1) (block 912 in FIG. 9).

An IC package that includes an impedance tuner circuit that includes the tunable formed in a RDL of a package substrate, including, but not limited to, the IC packages 300, 600, 700, and 800 in FIGS. 3A-3B, and 6A-8B, can be fabricated in other fabrication processes. For example, FIGS. 10A-10D is a flowchart illustrating an exemplary fabrication process 1000 of fabricating an IC package that includes an impedance tuner circuit that includes the tunable formed in a RDL of a package substrate. FIGS. 11A-11G illustrate exemplary fabrication stages 1100A-1100G according to the exemplary fabrication process 1000 in FIGS. 10A-10D. The fabrication process 1000 in FIGS. 10A-10D is discussed below with reference to the IC package 300 in FIGS. 3A and 3B, but the fabrication process 1000 is not limited to fabricating the IC package 300 in FIGS. 3A and 3B.

In this regard, as shown in the exemplary fabrication stage 1100A in FIG. 11A, a first step of the fabrication process 1000 can be to create the die 316 and form the switches 314(1), 314(2) in the active semiconductor layer 332 (e.g., FEOL) of the die 316 (block 1002 in FIG. 10A). Then, as shown in the exemplary fabrication stage 1100B in FIG. 11B, a next step of the fabrication process 1000 can be to form the metal interconnects 1102 in a metallization layer 1104 of the die 316 coupled to the switches 314(1), 314(2) and then form the die interconnects 340 for the die 316 (block 1004 in FIG. 10A). Some of the die interconnects 340 are coupled to the metal interconnects 1102 that are coupled to the switches 314(1), 314(2) to provide a signal routing path between the switches 314(1), 314(2) and the shunt taps 318(1), 318(2) in the package substrate 308 in which the die 316 will be coupled.

Figure 11C:
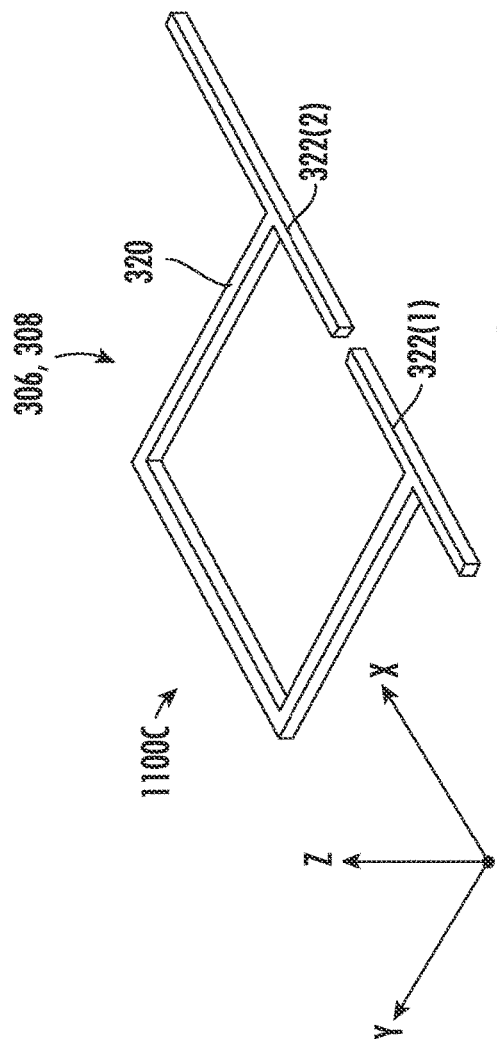
Figure 11D:
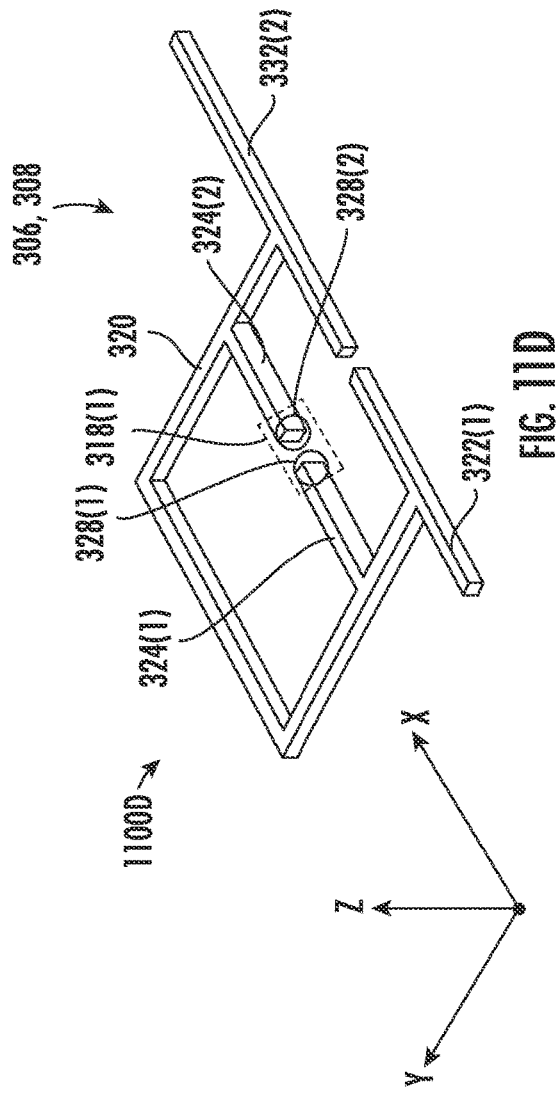
Figure 10B:
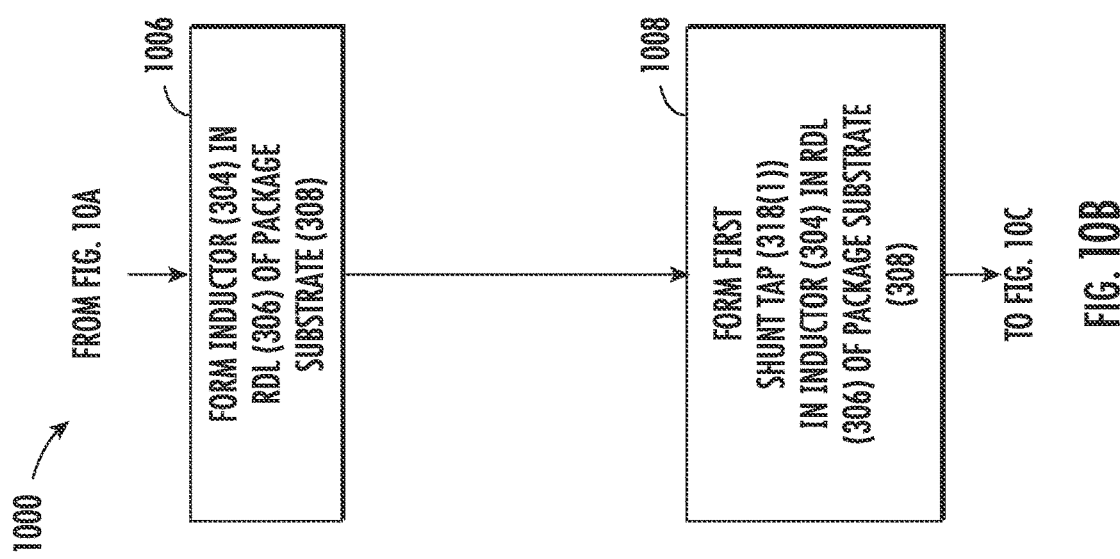
Figure 11G:
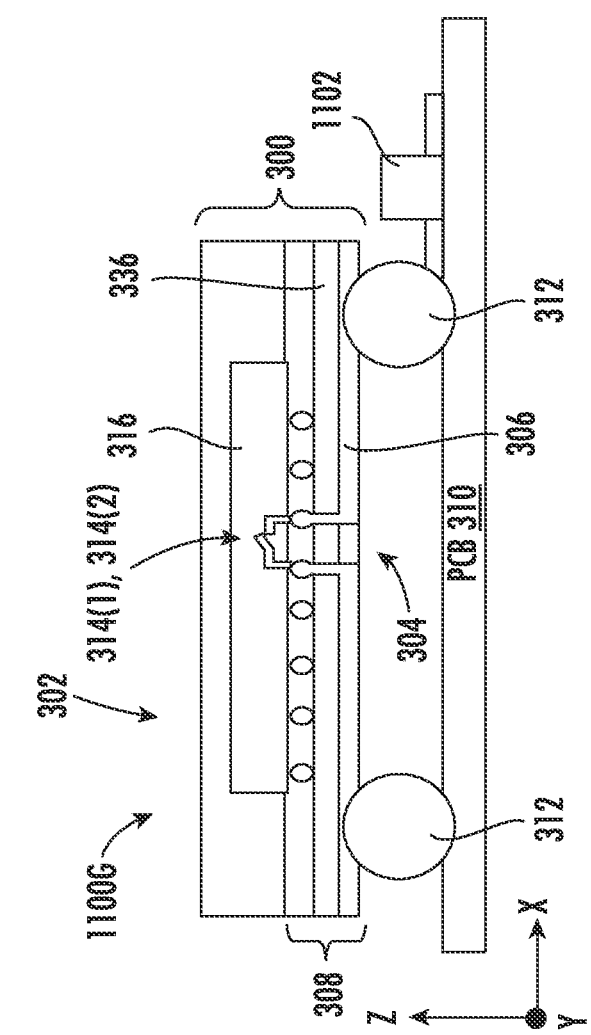
Figure 10D:
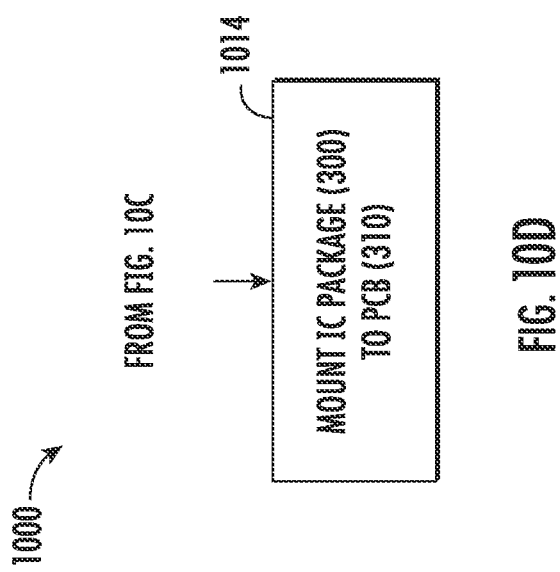

As shown in the exemplary fabrication stage 1100C in FIG. 11C, a next step of the fabrication process 1000 can be to form the inductor 304 in the RDL 306 of the package substrate 308 of the IC package 300 in FIG. 3B (block 1006 in FIG. 10A). The package substrate 308 is not shown in FIG. 11C, but is shown in FIG. 3B. The inductor is formed by forming the metal line 320 with the first and second terminals 322(1), 322(2). Then, as shown in the exemplary fabrication stage 1100D in FIG. 11D, a next step of the fabrication process 1000 can be to form the shunt taps 318(1), 318(2) in the inductor 304 (block 1008 in FIG. 10B and block 1010 in FIG. 10C). Only the first shunt tap 318(1) is shown as being formed in the inductor 304 in the fabrication stage 1100D in FIG. 11D, but note that the second shunt tap 318(2) can also be formed as shown in the fabrication stage 1100E in FIG. 11E. As shown in FIG. 11D, the shunt tap 318(1) is formed by forming shunt metal lines 324(1), 324(2) coupled to the respective first and second terminals 322(1), 322(2) with their ends 328(1), 328(2) adjacent to each other. The second shunt tap 318(2) is similarly formed in the inductor 304 as shown in FIG. 11E. Thus, when the die 316 is coupled to package substrate 308 that includes a RDL 306 with the inductor 304, the die interconnects 340 that are coupled to the switches 314(1), 314(2) are coupled to the respective shunt taps 318(1), 318(2) of the inductor.

Then, as shown in the exemplary fabrication stage 1100F in FIG. 11F, a next step of the fabrication process 1000 is to couple the die 316 to the package substrate 308 to couple the switches 314(1), 314(2) in the die 316 to the respective shunt taps 318(1), 318(2) in the RDL 306 of the package substrate 308 (block 1012 in FIG. 10C). Then, as shown in the exemplary fabrication stage 1100G in FIG. 11G, a next step of the fabrication process 1000 is to form the external interconnects 312 coupled to the package substrate 308 and mounting of the IC package 300 to the PCB 310 (block 1014 in FIG. 10D). Note that an external inductor 1106 may also be coupled to the PCB 310 and coupled to the impedance tuner circuit 302 in the IC package 300 through metal line routing through the PCB 310 and to an external interconnect 312.

The term "coupling" described herein can mean electrical coupling and/or physical coupling. Further, an IC package that includes an impedance tuner circuit that includes the tunable formed in a RDL of a package substrate, including but not limited to, the IC packages 300, 600, 700, and 800 in FIGS. 3A-3B and 6A-8B, and according to the exemplary fabrication processes 900, 1000 in FIGS. 9 and 10A-10D, and according to any aspects disclosed herein, may be provided in or integrated into any electronic device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 12 illustrates an exemplary wireless communications device 1200 as an electronic device that includes RF components formed from one or more integrated circuits (ICs) 1202, wherein any of the ICs 1202 can be included in an IC package 1203 that includes an impedance tuner circuit that includes the tunable formed in a RDL of a package substrate, including but not limited to, the IC packages 300, 600, 700, and 800 in FIGS. 3A-3B and 6A-8B. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion as well as noise in a receive frequency band. A PA 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Downconversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are also described in the following numbered clauses:
1. An integrated circuit (IC) package, comprising:
   an impedance tuner circuit, comprising:
      a first switch; and
      an inductor comprising a first terminal and a second terminal; and a package substrate comprising a first redistribution layer (RDL), the first RDL comprising the inductor; and a die coupled to the package substrate, the die comprising the first switch; the inductor comprising:
  a first metal line in the first RDL, the first metal line comprising the first terminal and the second terminal; and
  a first shunt tap in the first RDL, the first shunt tap coupled to the first terminal and the second terminal; and
the first switch coupled to the first shunt tap.

2. The IC package of clause 1, wherein the first switch is configured to be closed to shunt the first shunt tap.

3. The IC package of clause 1 or 2, wherein the first switch is configured to be open to provide an open circuit in the first shunt tap.

4. The IC package of any of clauses 1-3, wherein:
  the first switch comprises a first switch terminal and a second switch terminal;
  the first shunt tap comprises:
    a first shunt metal line coupled to the first terminal; and
    a second shunt metal line coupled to the second terminal; and
  the first switch terminal is coupled to the first shunt metal line, and the second switch terminal is coupled to the second shunt metal line.

5. The IC package of clause 4, wherein:
  the first shunt metal line comprises a first end coupled to the first terminal and a second end; and
  the second shunt metal line comprises a third end coupled to the second terminal and a fourth end adjacent to the second end.

6. The IC package of any of clauses 1-5, wherein:
  the first metal line extends along a first longitudinal axis; and
  the first shunt tap extends along a second longitudinal axis parallel to the first longitudinal axis.

7. The IC package of any of clauses 1-5, wherein:
  the first metal line extends along a first longitudinal axis; and
  the first shunt tap extends along a second longitudinal axis orthogonal to the first longitudinal axis.

8. The IC package of any of clauses 1-7, wherein:
  the impedance tuner circuit further comprises a second switch; and the die further comprises the second switch;
  the inductor further comprising a second shunt tap coupled to the first terminal and the second terminal; and
  the second switch coupled to the second shunt tap.

9. The IC package of clause 8, wherein:
  the second switch comprises a third switch terminal and a fourth switch terminal;
  the second shunt tap comprises:
    a third shunt metal line coupled to the first terminal; and
    a fourth shunt metal line coupled to the second terminal; and the third switch terminal is coupled to the third shunt metal line, and the fourth
    switch terminal is coupled to the fourth shunt metal line.

10. The IC package of any of clauses 1-10, wherein:
  the impedance tuner circuit further comprises a second switch;
  the die further comprises the second switch;
  the package substrate further comprises a second RDL; and the inductor further comprises:
    a second shunt tap in the second RDL;
    a first via coupling the second shunt tap to the first terminal; and
    a second via coupling the second shunt tap to the second terminal.

11. The IC package of clause 10, wherein:
  the second switch comprises a third switch terminal and a fourth switch terminal;
  the second shunt tap comprises:
    a third shunt metal line coupled to the first terminal; and
    a fourth shunt metal line coupled to the second terminal; and
  the third switch terminal is coupled to the third shunt metal line, and the fourth switch terminal is coupled to the fourth shunt metal line.

12. The IC package of clause 10 or 11, wherein:
  the first metal line extends along a first longitudinal axis;
  the first shunt tap extends along a second longitudinal axis parallel to the first longitudinal axis; and
  the second shunt tap extends along a third longitudinal axis that intersects the first longitudinal axis.

13. The IC package of any of clauses 1 to 12, wherein:
  the die comprises an active semiconductor layer; and
  the first switch is disposed in the active semiconductor layer.

14. The IC package of clause 4, wherein:
  the first switch terminal is coupled to a first die interconnect of the die;
  the second switch terminal is coupled to a second die interconnect of the die;
  the first die interconnect is coupled to a first metal interconnect of the package substrate coupled to the first shunt metal line; and
  the second die interconnect is coupled to a second metal interconnect of the package substrate coupled to the second shunt metal line.

15. The IC package of clause 14, wherein:
  the package substrate comprises a metallization layer adjacent to the first RDL; and
  the metallization layer comprises the first metal interconnect and the second metal interconnect.

16. The IC package of any of clauses 1-15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server, a computer, a portable computer, a mobile computing device; a wearable computing device; a desktop computer; a personal digital assistant (PDA); a monitor; a computer monitor, a television; a tuner, a radio; a satellite radio; a music player; a digital music player; a portable music player, a digital video player; a video player; a digital video disc (DVD) player; a portable digital video player, an automobile; a vehicle component; avionics systems; a drone; and a multicopter.

17. A method of fabricating an integrated circuit (IC) package, comprising:
  forming a first switch in a die;
  forming an inductor in a package substrate, comprising:
    forming a first metal line of the inductor in the first redistribution layer (RDL) in the package substrate, the first metal line comprising a first terminal and a second terminal; and
    forming a first shunt tap of the inductor in the first RDL, the first shunt tap coupled to the first terminal and the second terminal;
  coupling the die to the package substrate; and
  coupling the first switch to the first shunt tap.

18. The method of clause 17, wherein forming the die comprises:
  disposing an active semiconductor layer on a substrate; and
  forming the first switch in the active semiconductor layer.
19. The method of clause 17 or 18, further comprising forming the package substrate comprising:
  forming a first metal interconnect coupled to a first shunt metal line of the first shunt tap; and
  forming a second metal interconnect coupled to a second shunt metal line of the first shunt tap; and
  further comprising:
    coupling a first die interconnect to a first switch terminal of the first switch;
    coupling a second die interconnect to a second switch terminal of the second switch; and
    wherein coupling the die to the package substrate comprises:
      coupling the first die interconnect to the first metal interconnect; and
      coupling the second die interconnect to the second metal interconnect.
20. The method of clause 19, wherein:
  forming the package substrate further comprises forming a metallization layer adjacent to the first RDL;
  forming the first metal interconnect comprises forming the first metal interconnect in the metallization layer; and
  forming the second metal interconnect comprises forming the second metal interconnect in the metallization layer.
21. The method of any of clauses 17-20, wherein:
  the first switch comprises a first switch terminal and a second switch terminal;
  forming the first shunt tap comprises:
    forming a first shunt metal line in the first RDL coupled to the first terminal; and
    forming a second shunt metal line in the first RDL coupled to the second terminal; and
  coupling the die to the package substrate comprises:
    coupling the first switch terminal to the first shunt metal line; and
    coupling the second switch terminal to the second shunt metal line.
22. The method of any of clauses 17-21, wherein forming the inductor in the first RDL further comprises forming a second shunt tap in the first RDL, the second shunt tap coupled to the first terminal and second terminal; and
  further comprising:
    forming a second switch in the die; and
    coupling the second switch to the second shunt tap.
23. The method of any of clauses 17-22, further comprising:
  forming a second switch in the die; and
  forming the inductor further comprises:
    forming a second shunt tap in a second RDL in the package substrate, the first shunt tap coupled to the first terminal and the second terminal;
    forming a first via coupling the second shunt tap to the first terminal; and
    forming a second via coupling the second shunt tap to the second terminal; and
  coupling the second switch to the second shunt tap.

What is claimed is:
1. An integrated circuit (IC) package, comprising:
  an impedance tuner circuit, comprising:
    a first switch;
    a second switch; and
    an inductor comprising a first terminal and a second terminal;
  a package substrate comprising a first redistribution layer (RDL) and a second RDL, the first RDL comprising the inductor; and
  a die coupled to the package substrate, the die comprising:
    the first switch; and
    the second switch;
  the inductor comprising:
    a first metal line in the first RDL, the first metal line comprising the first terminal and the second terminal;
    a first shunt tap in the first RDL, the first shunt tap coupled to the first terminal and the second terminal;
    a second shunt tap in the second RDL;
    a first via coupling the second shunt tap to the first terminal; and
    a second via coupling the second shunt tap to the second terminal;
  the first switch coupled to the first shunt tap; and
  the second switch coupled to the second shunt tap.
2. The IC package of claim 1, wherein the first switch is configured to be closed to shunt the first shunt tap.
3. The IC package of claim 1, wherein the first switch is configured to be open to provide an open circuit in the first shunt tap.
4. The IC package of claim 1, wherein:
  the first switch comprises a first switch terminal and a second switch terminal;
  the first shunt tap comprises:
    a first shunt metal line coupled to the first terminal; and
    a second shunt metal line coupled to the second terminal; and
  the first switch terminal is coupled to the first shunt metal line, and the second switch terminal is coupled to the second shunt metal line.
5. The IC package of claim 4, wherein:
  the first shunt metal line comprises a first end coupled to the first terminal and a second end; and
  the second shunt metal line comprises a third end coupled to the second terminal and a fourth end adjacent to the second end.
6. The IC package of claim 4, wherein:
  the first switch terminal is coupled to a first die interconnect of the die;
  the second switch terminal is coupled to a second die interconnect of the die;
  the first die interconnect is coupled to a first metal interconnect of the package substrate coupled to the first shunt metal line; and
  the second die interconnect is coupled to a second metal interconnect of the package substrate coupled to the second shunt metal line.
7. The IC package of claim 6, wherein:
  the package substrate comprises a metallization layer adjacent to the first RDL; and
  the metallization layer comprises the first metal interconnect and the second metal interconnect.
8. The IC package of claim 1, wherein:
  the first metal line extends along a first longitudinal axis; and
  the first shunt tap extends along a second longitudinal axis parallel to the first longitudinal axis.
9. The IC package of claim 1, wherein:
  the first metal line extends along a first longitudinal axis; and the first shunt tap extends along a second longitudinal axis orthogonal to the first longitudinal axis.

10. The IC package of claim 1, wherein:
the second switch comprises a third switch terminal and a fourth switch terminal;
the second shunt tap comprises:
a third shunt metal line coupled to the first terminal; and
a fourth shunt metal line coupled to the second terminal; and
the third switch terminal is coupled to the third shunt metal line, and the fourth switch terminal is coupled to the fourth shunt metal line.

11. The IC package of claim 1, wherein:
the second switch comprises a third switch terminal and a fourth switch terminal;
the second shunt tap comprises:
a third shunt metal line coupled to the first terminal; and
a fourth shunt metal line coupled to the second terminal; and
the third switch terminal is coupled to the third shunt metal line, and the fourth switch terminal is coupled to the fourth shunt metal line.

12. The IC package of claim 1, wherein:
the first metal line extends along a first longitudinal axis;
the first shunt tap extends along a second longitudinal axis parallel to the first longitudinal axis; and
the second shunt tap extends along a third longitudinal axis that intersects the first longitudinal axis.

13. The IC package of claim 1, wherein:
the die comprises an active semiconductor layer; and
the first switch is disposed in the active semiconductor layer.

14. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server, a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A method of fabricating an integrated circuit (IC) package, comprising:
forming a first switch in a die;
forming a second switch in the die;
forming an inductor in a package substrate, comprising:
forming a first metal line of the inductor in a first redistribution layer (RDL) in the package substrate, the first metal line comprising a first terminal and a second terminal;
forming a first shunt tap of the inductor in the first RDL, the first shunt tap coupled to the first terminal and the second terminal;
forming a second shunt tap in a second RDL in the package substrate, the first shunt tap coupled to the first terminal and the second terminal;
forming a first via coupling the second shunt tap to the first terminal; and
forming a second via coupling the second shunt tap to the second terminal;
coupling the die to the package substrate;
coupling the first switch to the first shunt tap; and
coupling the second switch to the second shunt tap.

16. The method of claim 15, wherein forming the die comprises:
disposing an active semiconductor layer on a substrate; and
forming the first switch in the active semiconductor layer.

17. The method of claim 16, further comprising forming the package substrate comprising:
forming a first metal interconnect coupled to a first shunt metal line of the first shunt tap; and
forming a second metal interconnect coupled to a second shunt metal line of the first shunt tap; and
further comprising:
coupling a first die interconnect to a first switch terminal of the first switch;
coupling a second die interconnect to a second switch terminal of the second switch; and
wherein coupling the die to the package substrate comprises:
coupling the first die interconnect to the first metal interconnect; and
coupling the second die interconnect to the second metal interconnect.

18. The method of claim 17, wherein:
forming the package substrate further comprises forming a metallization layer adjacent to the first RDL;
forming the first metal interconnect comprises forming the first metal interconnect in the metallization layer; and
forming the second metal interconnect comprises forming the second metal interconnect in the metallization layer.

19. The method of claim 15, wherein:
the first switch comprises a first switch terminal and a second switch terminal;
forming the first shunt tap comprises:
forming a first shunt metal line in the first RDL coupled to the first terminal; and
forming a second shunt metal line in the first RDL coupled to the second terminal; and
coupling the die to the package substrate comprises:
coupling the first switch terminal to the first shunt metal line; and
coupling the second switch terminal to the second shunt metal line.

20. The method of claim 15, wherein:
forming the second switch comprises forming a third switch terminal and a fourth switch terminal in the die;
forming the second shunt tap comprises:
forming a third shunt metal line in the second RDL coupled to the first terminal; and
forming a fourth shunt metal line in the second RDL coupled to the second terminal; and
coupling the third switch terminal to the third shunt metal line; and
coupling the fourth switch terminal to the fourth shunt metal line.

21. The method of claim 17, wherein:
forming the first metal line further comprises forming the first metal line extending along a first longitudinal axis;
forming the first shunt tap further comprises forming the first shunt tap extending along a second longitudinal axis parallel to the first longitudinal axis; and
forming the second shunt tap further comprises forming the second shunt tap extending along a third longitudinal axis that intersects the first longitudinal axis.

\* \* \* \* \*